(12) United States Patent
Nishimura et al.

(10) Patent No.: US 6,487,110 B2
(45) Date of Patent: Nov. 26, 2002

(54) NONVOLATILE SOLID-STATE MEMORY DEVICE USING MAGNETORESISTIVE EFFECT AND RECORDING AND REPRODUCING METHOD OF THE SAME

(75) Inventors: Naoki Nishimura; Yoshinobu Sekiguchi, both of Tokyo; Tadahiko Hirai, Kanagawa, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/963,519

(22) Filed: Sep. 27, 2001

(65) Prior Publication Data

US 2002/0036917 A1 Mar. 28, 2002

(30) Foreign Application Priority Data

Sep. 27, 2000 (JP) ........................................ 2000-294254
Sep. 27, 2001 (JP) ........................................ 2001-295704

(51) Int. Cl.[7] .............................................. G11C 11/15
(52) U.S. Cl. ...................... 365/158; 365/173; 365/171; 365/51; 365/66; 365/63; 365/209; 365/207
(58) Field of Search ................................ 365/158, 173, 365/171, 51, 66, 63, 189.07, 209, 207, 225.5, 243.5; 257/298, 300, 296

(56) References Cited

U.S. PATENT DOCUMENTS

| 5,940,319 | A | | 8/1999 | Durlam et al. ............... 365/171 |
| 6,055,179 | A | * | 4/2000 | Koganei et al. ............. 365/158 |
| 6,104,632 | A | * | 8/2000 | Nishimura ................... 365/158 |
| 6,111,784 | A | | 8/2000 | Nishimura ................... 365/173 |
| 6,226,197 | B1 | | 5/2001 | Nishimura ................... 365/171 |

FOREIGN PATENT DOCUMENTS

| JP | 6-84347 | * | 3/1994 | ........... G11C/11/15 |
| JP | 6-243673 | * | 9/1994 | ........... G11C/11/14 |
| JP | 9-45074 | * | 2/1997 | ........... G11C/11/15 |

* cited by examiner

*Primary Examiner*—Andrew Q. Tran
(74) *Attorney, Agent, or Firm*—Fitzpatrick, Cella, Harper & Scinto

(57) ABSTRACT

The fabrication process of a conventional MRAM using a magnetoresistive effect element as a memory device is difficult, and the device structure makes it difficult to decrease the cell area and increase the degree of integration. It is an object of this invention to realize an MRAM which can achieve a high integration degree. A memory device is characterized by including a magnetoresistive element, a bit line formed above this magnetoresistive element, and a write line. The magnetoresistive element is formed immediately above the drain region of a field-effect transistor.

21 Claims, 24 Drawing Sheets

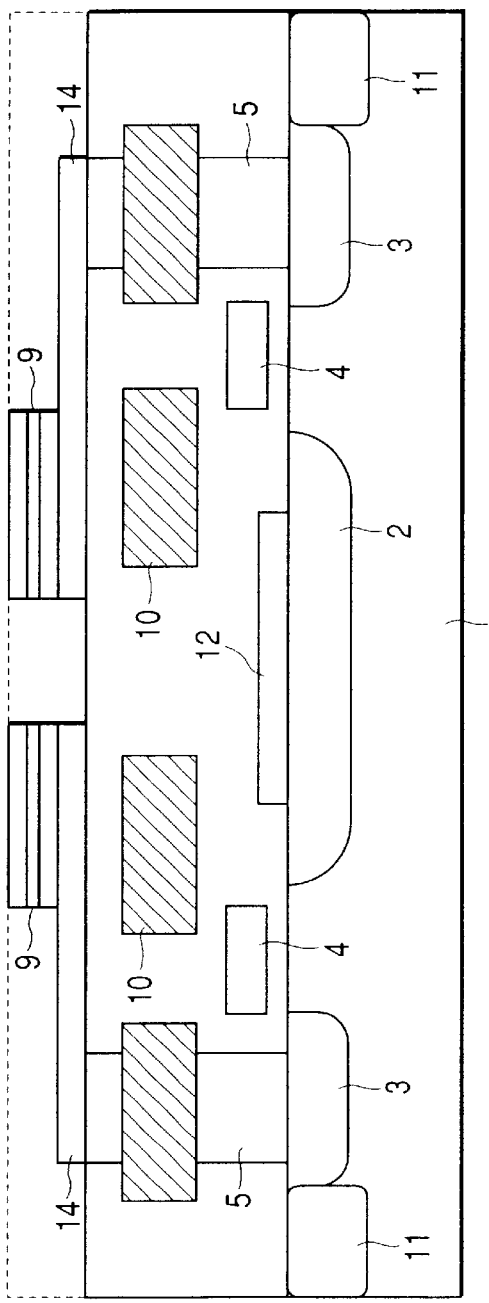
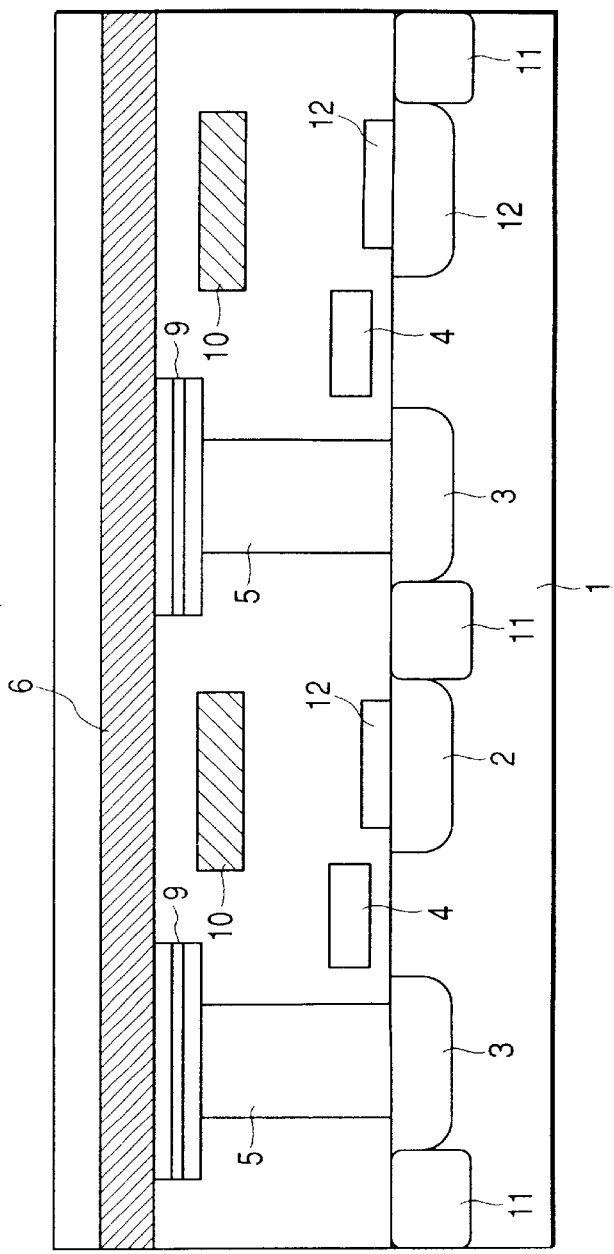
FIG. 7
PRIOR ART
FIG. 8

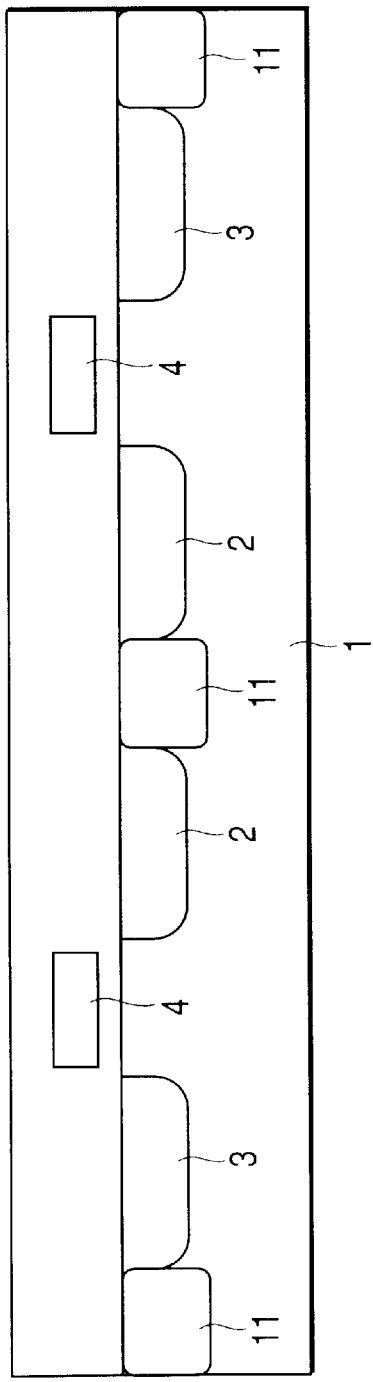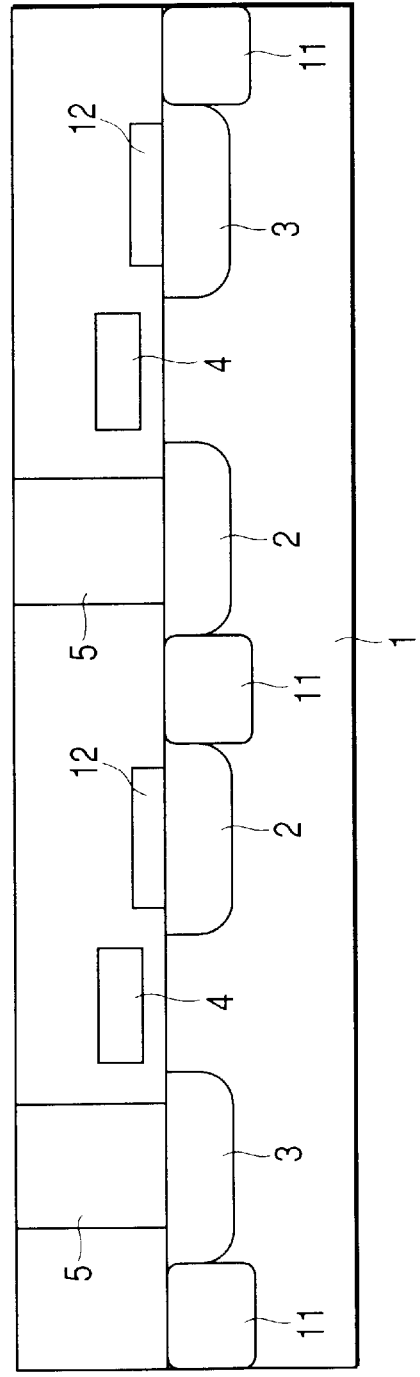

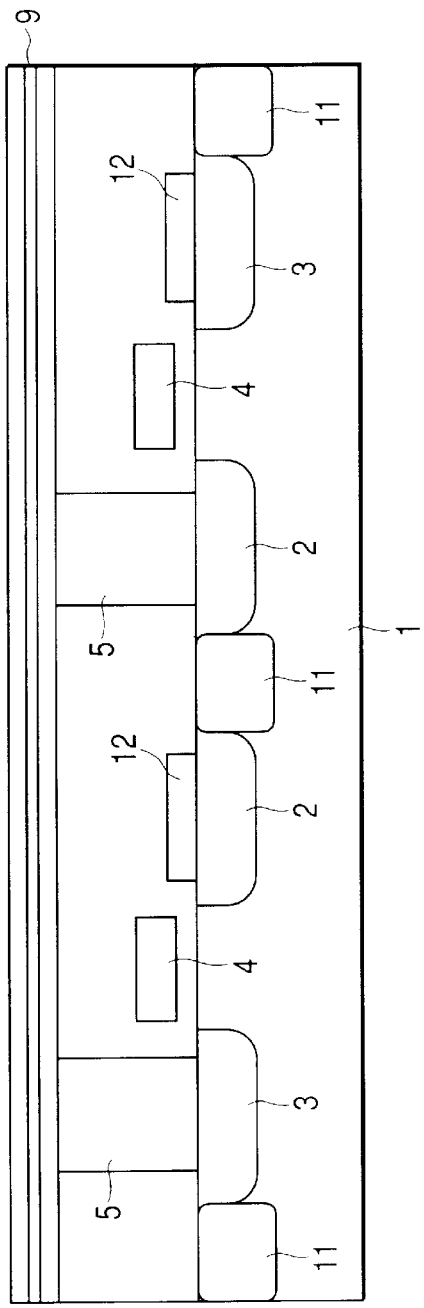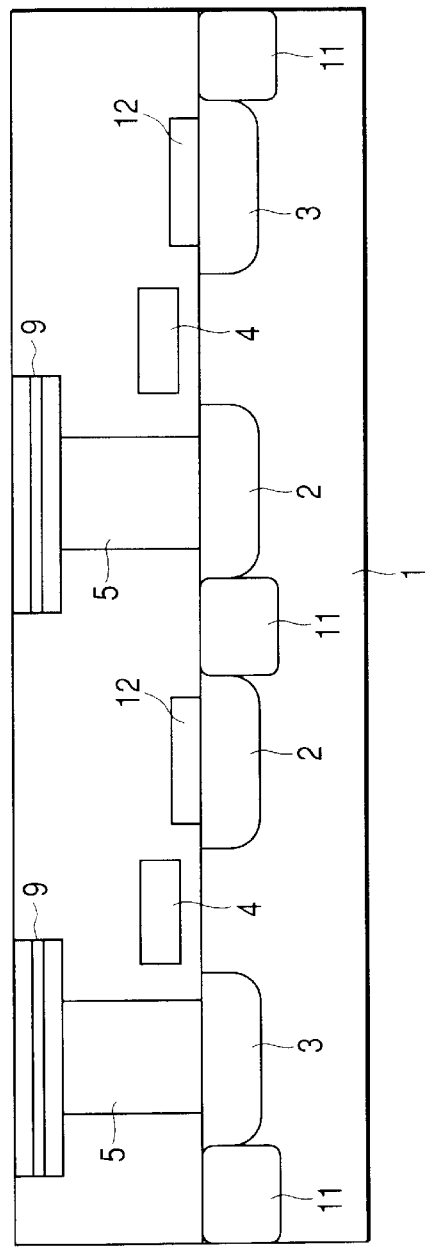

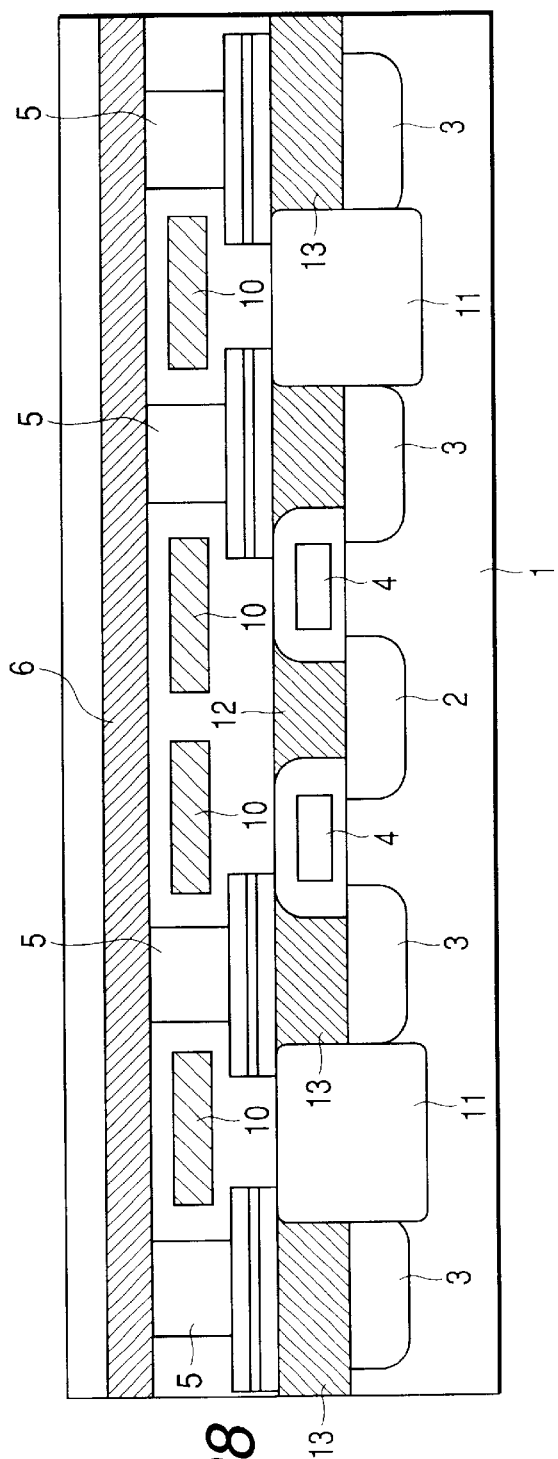
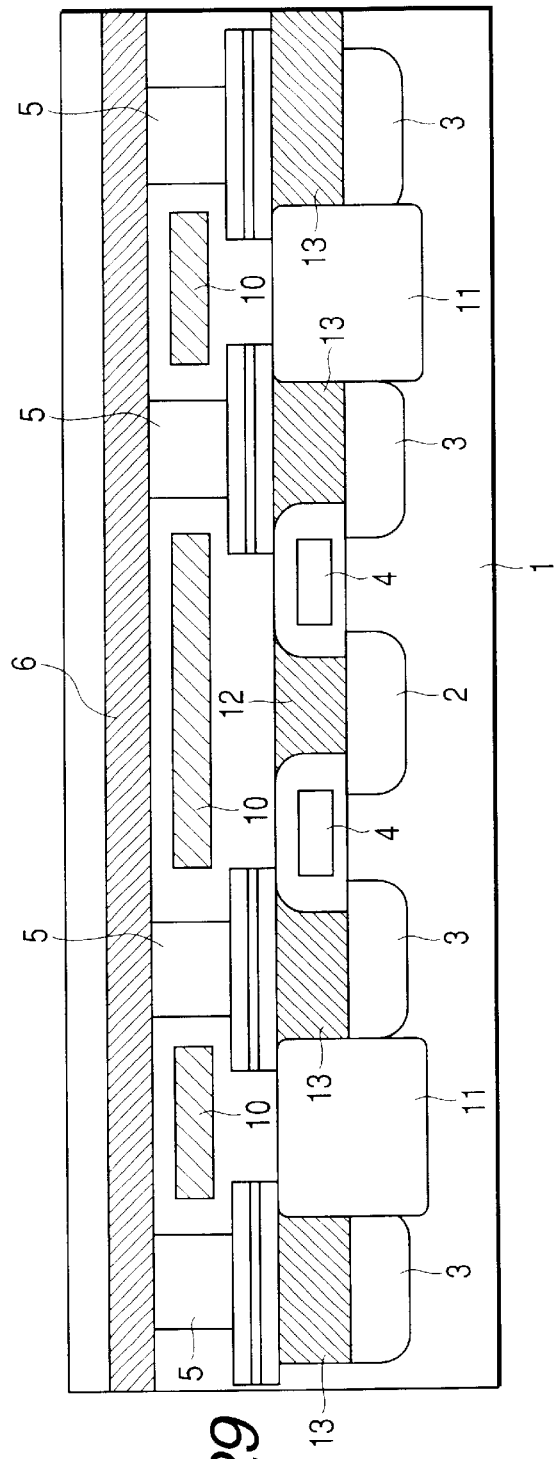

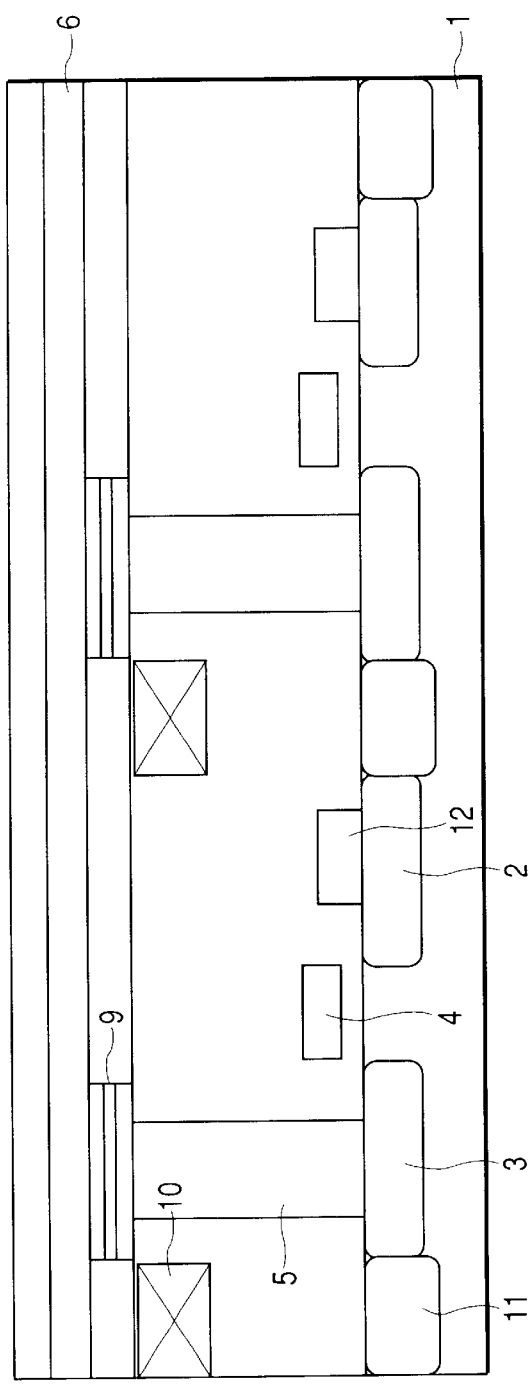
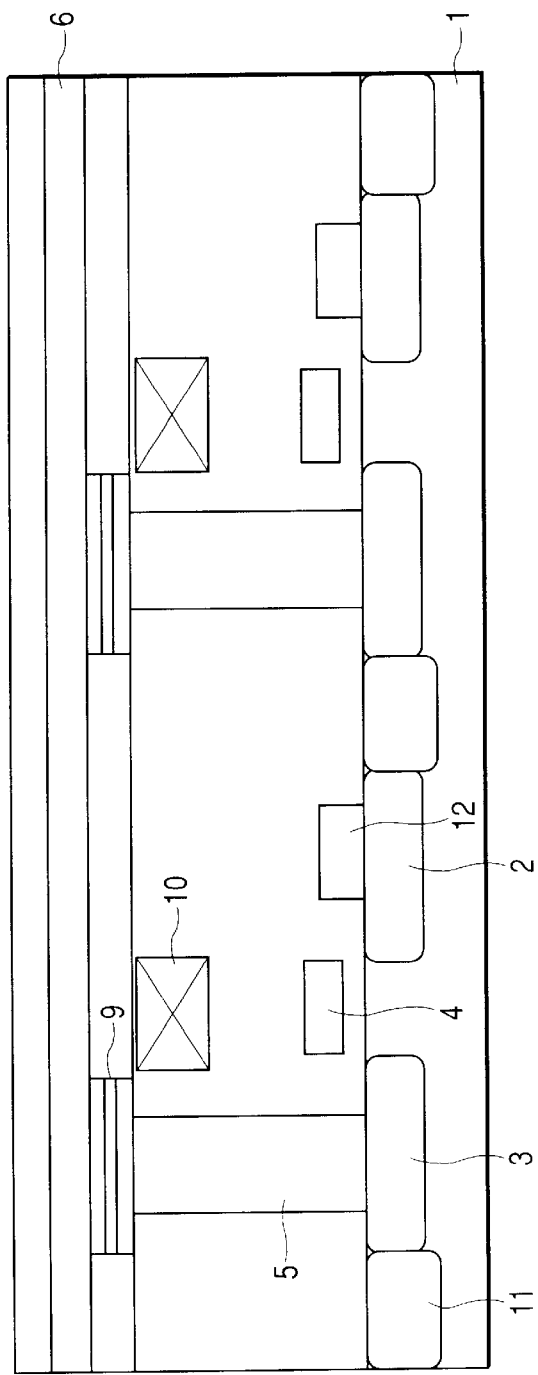
FIG. 37
FIG. 38

NONVOLATILE SOLID-STATE MEMORY DEVICE USING MAGNETORESISTIVE EFFECT AND RECORDING AND REPRODUCING METHOD OF THE SAME

BACKGROUND OF THE INVENTION

1. Field of the Invention

The present invention relates to a nonvolatile solid-state memory device and memory using a magnetoresistive film, and a recording/reproducing method of the memory device and memory.

2. Related Background Art

A Magnetic Random Access Memory (MRAM) is a solid-state memory having no active portion similar to a semiconductor memory. Compared to a semiconductor memory, however, this magnetic thin-film memory has advantages that no information is lost even when the power supply is shut down, data can be repetitively rewritten an unlimited number of times, and no recorded contents disappear even upon incidence of radiation. In particular, a magnetic thin-film memory using a spin tunnel effect (TMR) has attracted attention because of its high output, compared to conventionally provided magnetic thin-film memories using an anisotropic magnetoresistive effect and a spin scattering type giant magnetoresistive effect (GMR).

For example, U.S. Pat. No. 5,940,319 discloses the structure of a device in which a memory cell is formed by connecting a transistor and a magnetoresistive element which is magnetized in the plane of the film, as shown in FIG. 1. This device is formed by a process shown in FIGS. 3 to 7.

First, a field-effect transistor (MOSFET) is fabricated by a CMOS process by forming a source region 2, a drain region 3, a LOCOS oxide film 11, a gate electrode 4, a source electrode 12, and a plug electrode 5 on a p-type Si substrate 1 (FIG. 3). After an insulating film is formed and patterned, write lines 10 are buried and planarized by CMP (FIG. 4). A lower electrode 14 of a magnetoresistive film is formed and planarized by CMP (FIG. 5), and a magnetoresistive film 9 is formed (FIG. 6). After that, this magnetoresistive film 9 and the lower electrode 14 are processed (FIG. 7), an insulating film is formed, and a bit line (upper electrode) 6 is formed to complete the device (FIG. 1).

To detect the resistive value of the magnetoresistive film, an electric current is supplied in a direction perpendicular to the film plane so that the current flows through a tunnel barrier film. Since an MRAM generally uses an in-plane magnetization film as the magnetoresistive film, the write lines 10 must be arranged below or above the magnetic film. For example, the write lines 10 are arranged below the magnetoresistive film 9 in FIG. 1. Accordingly, the lower electrode 14 and the insulating film are interposed between the write lines and the magnetoresistive film. Additionally, to connect the lower electrode 14 to the drain region 3 of the field-effect transistor, the magnetoresistive film must be formed in a place shifted sideways from the drain region.

This poses the following problems.

First, when the magnetoresistive film and the lower electrode are patterned (FIGS. 6 and 7), it is necessary to form a region in which the magnetoresistive film is removed and the lower electrode is not entirely removed but partially left behind. In this etching step, a film which produces any extra resistance cannot be inserted between the magnetic film and the lower electrode, because both the magnetic film and the lower electrode are metals. This makes it difficult to stop the etching at appropriate positions uniformly on the wafer.

Second, since it is necessary to selectively form a portion where both the magnetoresistive film and the lower electrode are removed and a portion where the lower electrode is left behind, the number of mask steps increases to complicate the process.

Third, both the insulating film and the lower electrode exist between the magnetoresistive film and the write lines. This increases the distance between the magnetoresistive film and the write lines and thereby prevents efficient application of a generated magnetic field from the write lines to the magnetoresistive film. In addition, the lower electrode must be thick since etching stop position variations during the process must be taken into consideration and it is necessary to prevent disconnection even when a repetitive electric current is supplied. This makes shortening of the distance and consequently miniaturization of the memory device difficult.

Fourth, the plug electrode 5 is formed on the drain region 3 with a certain positional deviation margin. Therefore, the device must be designed with an extra margin, and this makes the cell area difficult to reduce.

In addition to these problems, when an in-plane magnetization film is used as the magnetic film, a demagnetizing field (self-demagnetizing field) generated inside the magnetic layer becomes no longer negligible as the area of a bit cell is decreased, so the magnetization direction in the magnetic layer for recording is not fixed in one direction but becomes unstable. Accordingly, the information storage stability of the conventional magnetic thin-film memory lowers as the degree of microfabrication of bit cells increases, and this makes memory devices difficult to miniaturize. This is particularly significant when the size is 1 μm or less. In an in-plane magnetization film, therefore, the length in the direction of the axis of easy magnetization must be twice or more, and in practice about four times the width of the film. FIG. 2 shows a structure in which a memory cell having the arrangement shown in FIG. 1 is viewed from above. As shown in FIG. 2, minimum dimensions of the cell are 3F (F is a minimum fabrication dimension) in width and 3F to 5F in the write line direction. Even when the alignment margin is completely ignored, the cell area is as large as $9 \times F^2$ to $15 \times F^2$. Referring to FIG. 1, the source electrode 12 is shared by adjacent cells. If this sharing is not performed, however, the cell width becomes 4F, and this further increases the cell area to $12 \times F^2$ or more. Accordingly, high integration is difficult to perform.

SUMMARY OF THE INVENTION

As described above, in an MRAM having a difficult fabrication process, the device structure makes it difficult to decrease the cell area and increase the degree of integration.

The present invention has been made in consideration of the above situation, and has as its object to realize an MRAM which can achieve a high integration degree without complicating the fabrication process.

The above object is achieved by a memory comprising a substrate, a magnetoresistive element which is formed on the substrate and has a structure in which first and second magnetic layers are stacked, and a nonmagnetic layer is sandwiched between the first and second magnetic layers, a bit line formed on a side of the magnetoresistive element away from a side opposing the substrate, and a write line which changes a magnetization direction in the first or second magnetic layers by a magnetic field generated by an electric current, and a transistor, wherein the magnetoresistive element is formed immediately above a drain region of the transistor.

The above object is achieved by a memory in which the axis of easy magnetization of the first and/or second magnetic film is perpendicular to the film plane.

The above object is achieved by a memory in which the nonmagnetic layer is an insulator.

The above object is achieved by a memory in which the magnetoresistive effect elements are formed in a matrix on the substrate.

The above object is achieved by a memory in which a drain electrode occupies for 50% or more of the area of the drain region.

The above object is achieved by a memory in which the write line is formed closer to the substrate than the magnetoresistive effect element.

The above object is achieved by a memory in which the magnetoresistive effect element is formed after the transistor and the write line are formed on the substrate.

The above object is achieved by a memory in which the write line is formed, via an insulating layer, on an element isolation region or on a gate electrode of a transistor formed on a silicon substrate.

The above object is achieved by a memory in which a ground electrode is connected to a source region of the transistor and shared by two adjacent magnetoresistive elements.

The above object is achieved by a memory in which the write lines are formed on the two sides of the magnetoresistive element, and electric currents are allowed to flow through the write lines in opposite directions to change the magnetization states of the magnetic layers of the magnetoresistive element.

The above object is achieved by a memory in which at least one write line is formed on an element isolation region or on a gate electrode of the transistor via an insulating layer.

The above object is achieved by a memory in which the write line is shared by adjacent magnetoresistive elements.

The above object is achieved by a memory in which the ground electrode connected to the source region of the transistor also functions as the write line.

The above object is achieved by a memory in which the magnetoresistive film is directly formed on the drain region of the transistor.

The above object is achieved by a memory in which a gate electrode of the transistor also functions as the write line.

The above object is achieved by a memory in which the first magnetic layer and/or the second magnetic layer is made of a rare earth-iron family alloy.

The above object is achieved by a memory in which in the rare earth-iron family alloy, a rare earth element contains at least one element selected from the group consisting of Gd, Tb, and Dy, and an iron family element contains at least one element selected from the group consisting of Fe and Co.

The above object is achieved by a memory in which a magnetic layer containing at least one element selected from the group consisting of Fe and Co is formed between the first magnetic layer and the nonmagnetic layer and/or between the second magnetic layer and the nonmagnetic layer.

The above object is achieved by a recording/reproducing method of the above-mentioned memory, comprising recording information by initializing the magnetization direction in the first magnetic layer to a predetermined direction and determining the magnetization direction in the second magnetic layer of the magnetoresistive element by supplying an electric current to the write line, and reproducing recorded information by detecting the absolute value of the resistance of the magnetoresistive element.

The above object is achieved by a recording/reproducing method of the above-mentioned memory, comprising recording information by determining the magnetization direction in the first magnetic layer of the magnetoresistive element by supplying an electric current to the write line, and reproducing recorded information by reversing the magnetization direction in the second magnetic layer and detecting the generated change in the resistance.

BRIEF DESCRIPTION OF THE DRAWINGS

FIG. 7 is a sectional view showing an example of the process of the memory device shown in FIG. 1;

FIG. 8 is a sectional view of a memory of the first embodiment;

FIG. 11 is a sectional view showing the fabrication process of the memory of the first embodiment;

FIG. 12 is a sectional view showing the fabrication process of the memory of the first embodiment;

FIG. 13 is a sectional view showing the fabrication process of the memory of the first embodiment;

FIG. 14 is a sectional view showing the fabrication process of the memory of the first embodiment;

FIG. 28 is a sectional view of a memory of the fourth embodiment, in which two write lines are formed for one element;

FIG. 29 is a sectional view of a memory of the fifth embodiment, in which a write line is shared by adjacent elements;

FIG. 37 is a sectional view of a memory of the ninth embodiment, in which a write line is formed on an element isolation region;

FIG. 38 is a sectional view of a memory of the ninth embodiment, in which a write line is formed on a gate electrode.

DESCRIPTION OF THE PREFERRED EMBODIMENTS

Figure 1:
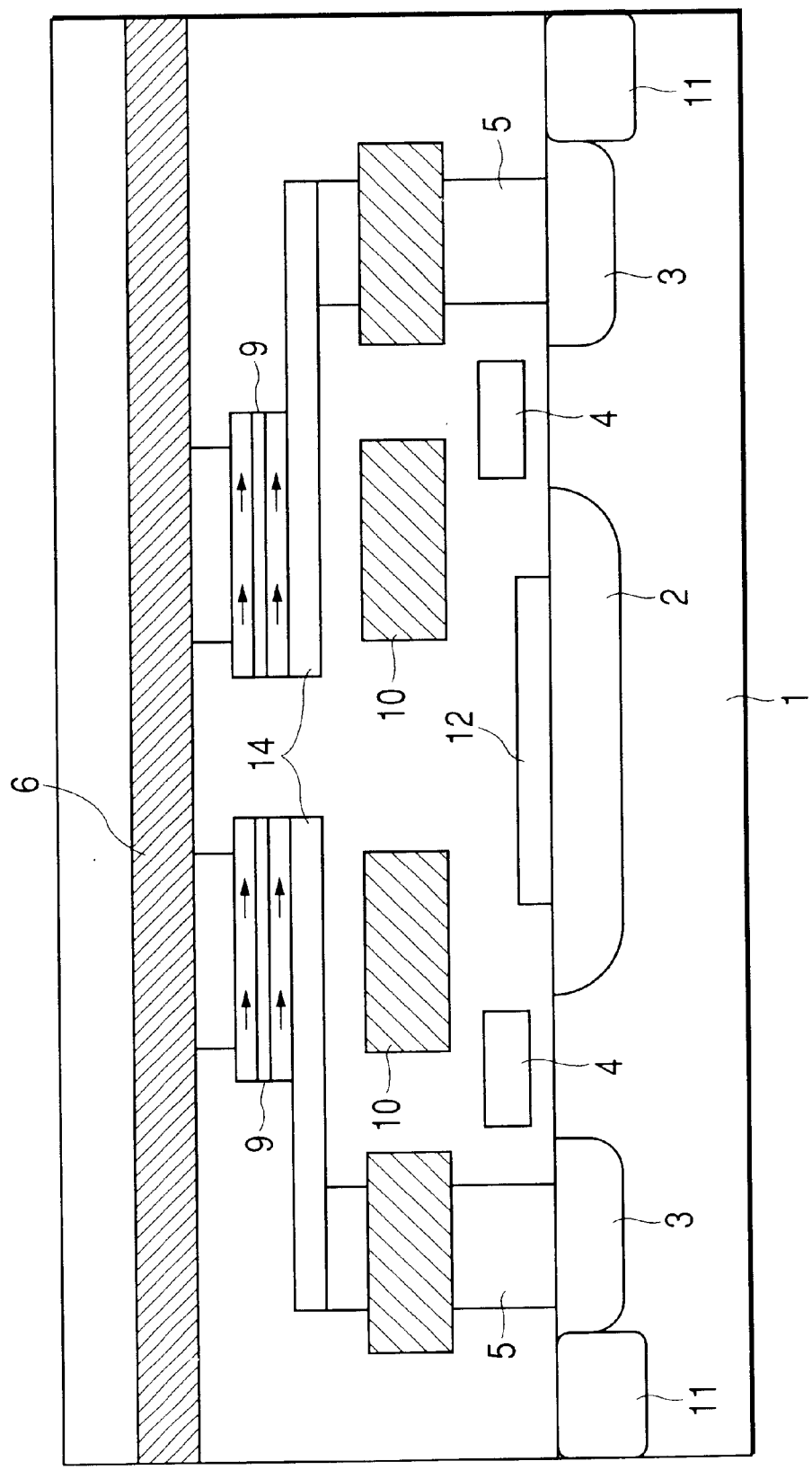
FIG. 1 is a sectional view of an example of a conventional memory device.
Figure 2:
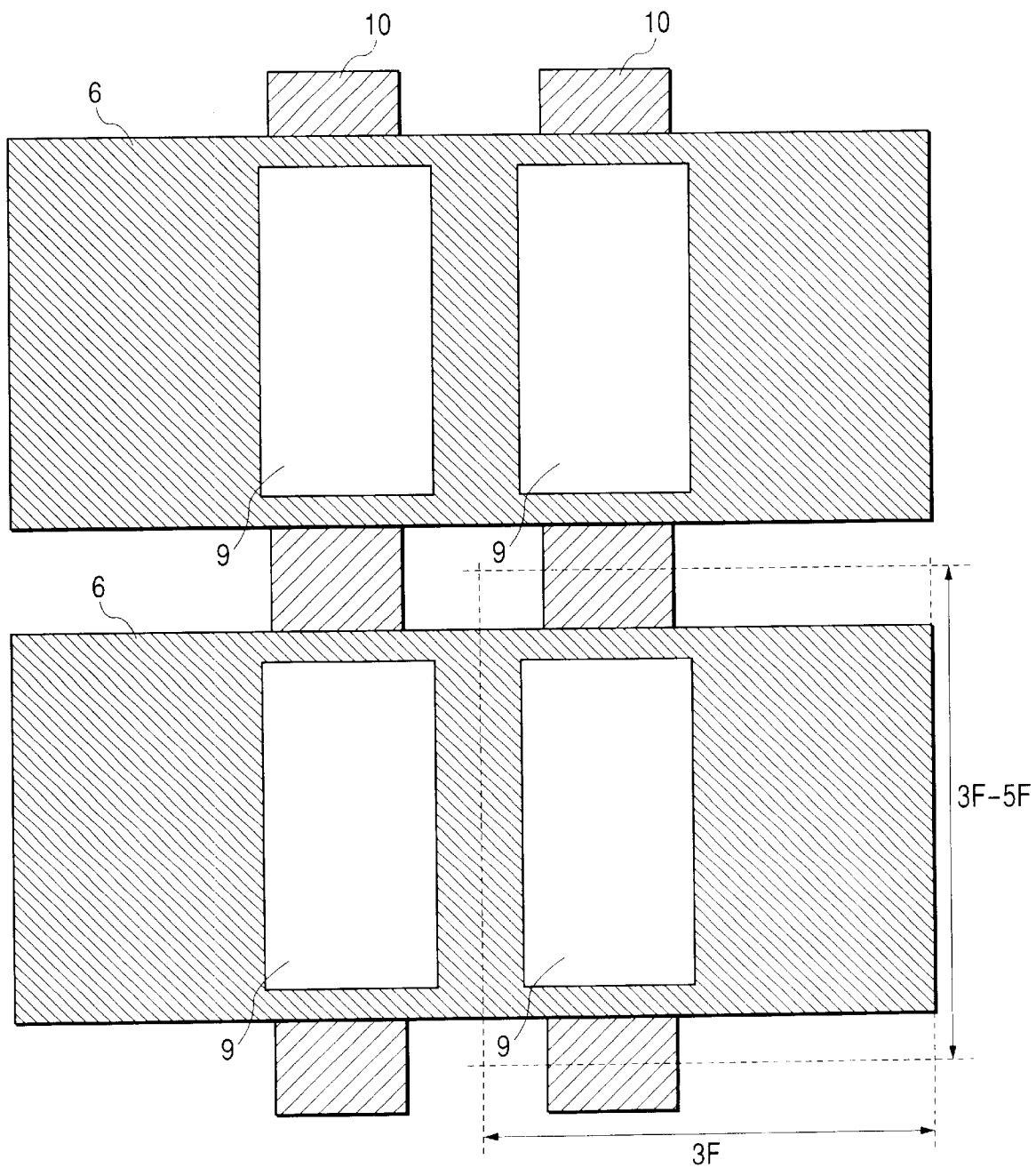
FIG. 2 is a planar view of the memory shown in FIG. 1.
Figure 3:
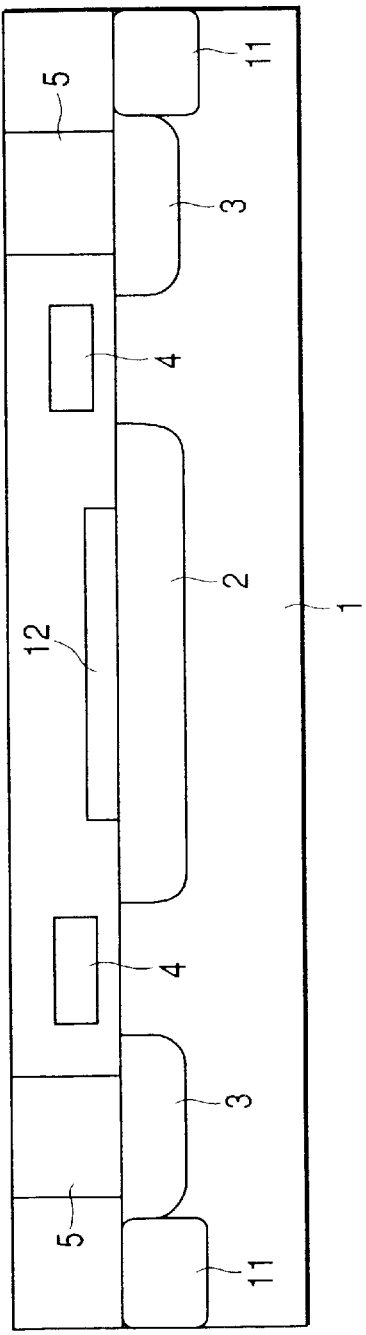
FIG. 3 is a sectional view showing an example of the process of the memory device shown in FIG. 1.
Figure 4:
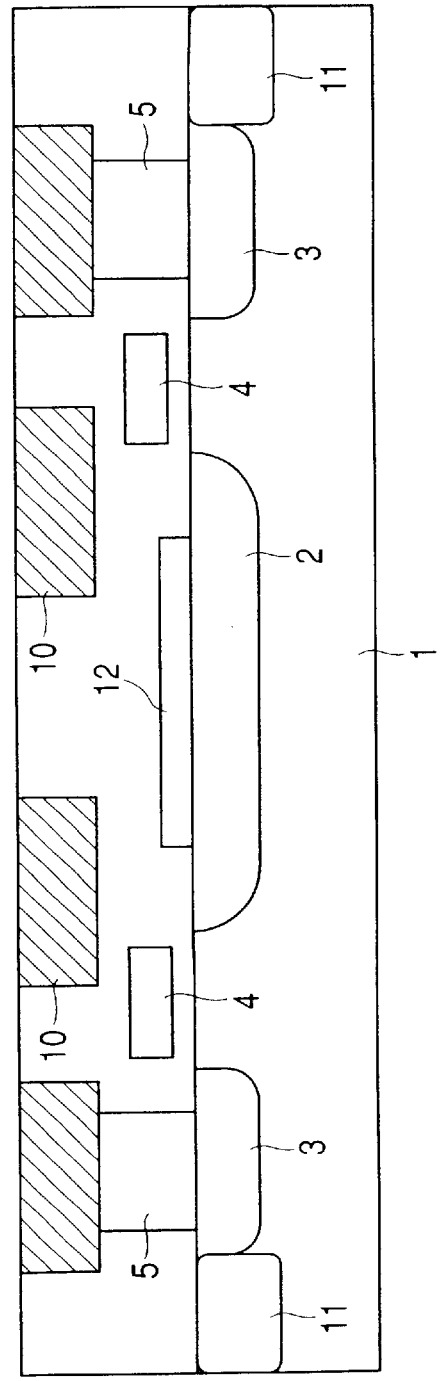
FIG. 4 is a sectional view showing an example of the process of the memory device shown in FIG. 1.
Figure 5:
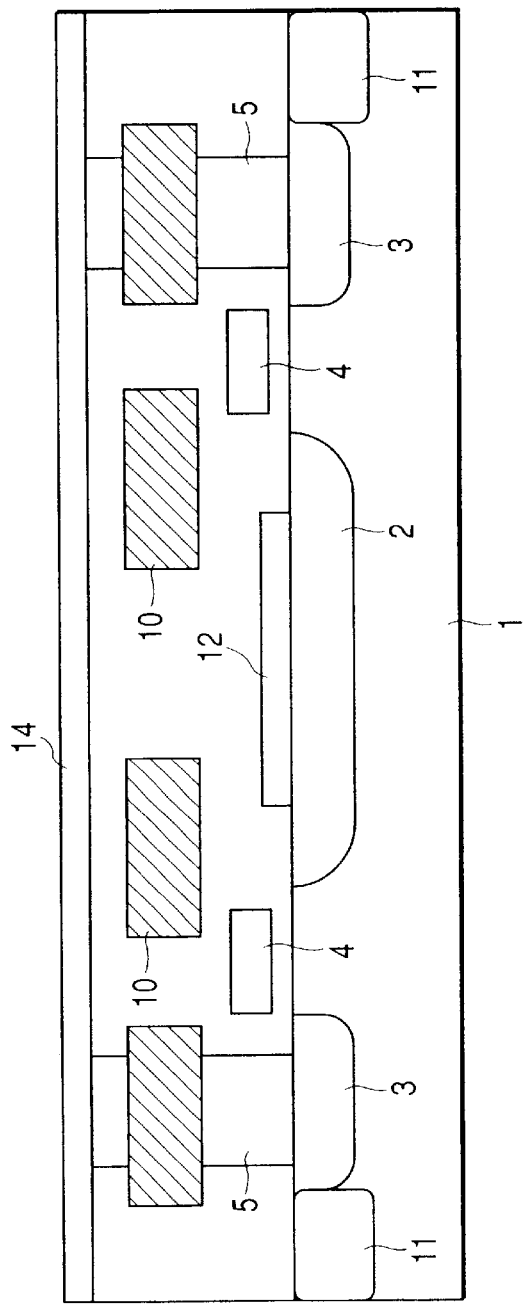
FIG. 5 is a sectional view showing an example of the process of the memory device shown in FIG. 1.
Figure 6:
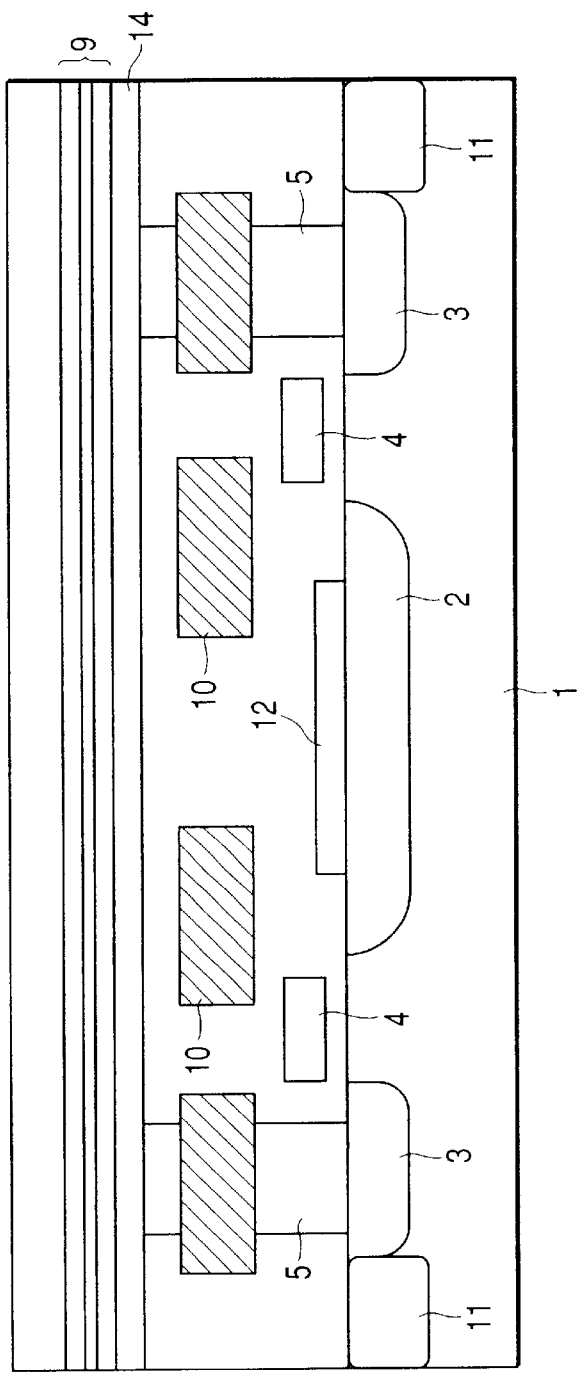
FIG. 6 is a sectional view showing an example of the process of the memory device shown in FIG. 1.

Embodiments of the present invention will be described below with reference to the accompanying drawings.

First Embodiment

FIG. 8 shows the sectional structure of a memory device of this embodiment. Portions having no reference numerals attached are basically insulators. Source regions 2 and drain regions 3 are formed in a semiconductor substrate 1, and gate electrodes 4 are also formed via an insulating film, thereby constructing MOS (Metal-Oxide-Semiconductor)-FETs (Field-Effect Transistors). The individual field-effect transistors are electrically isolated by LOCOS field oxide regions 11.

Figure 9:
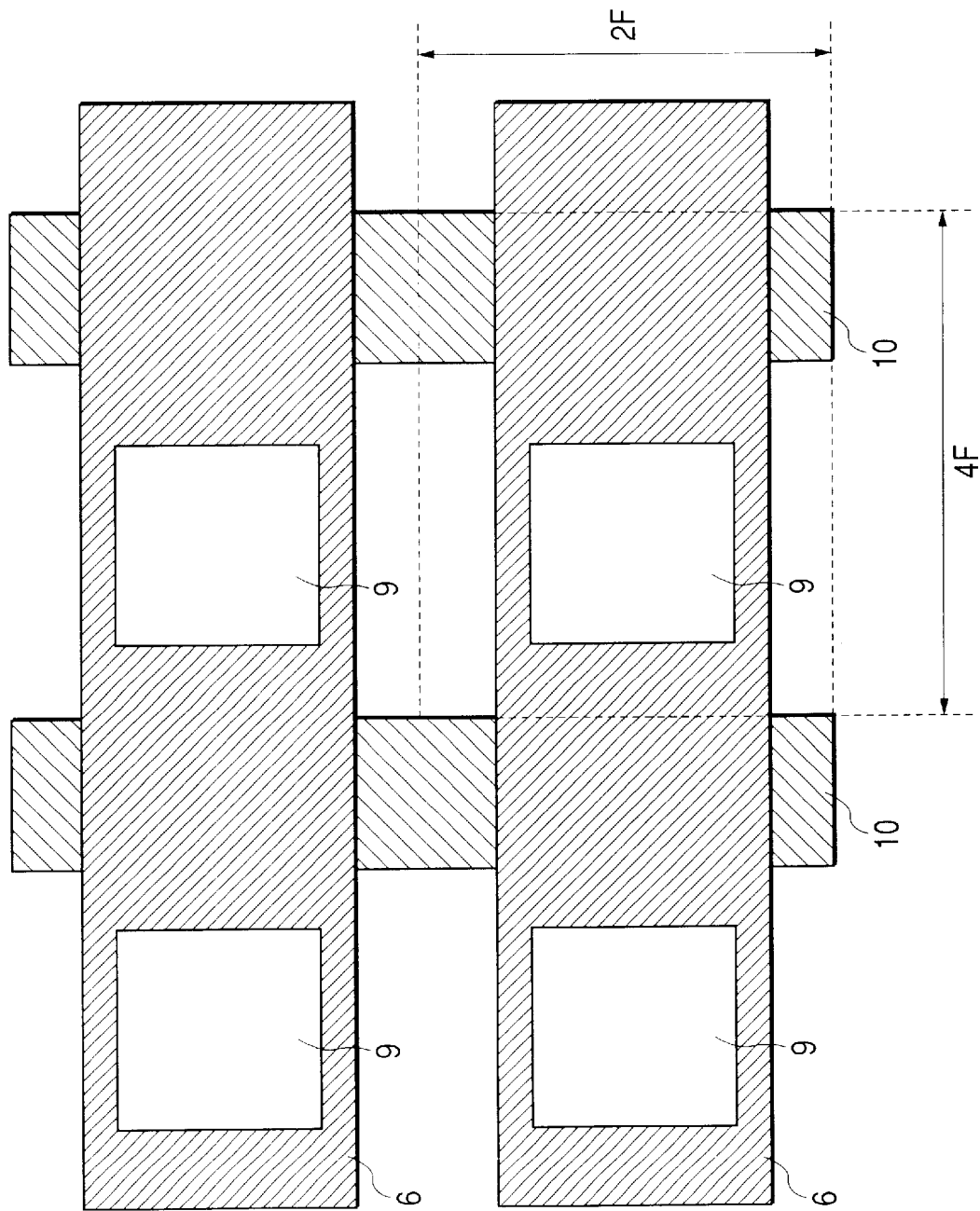
FIG. 9 is a plan view of the memory of the first embodiment.

A magnetoresistive film 9 having a magnetic film magnetized in a direction perpendicular to the film plane is formed immediately above the drain 3 of each field-effect transistor and connected to the drain 3 via a plug electrode 5. This magnetoresistive film 9 is also connected to a bit line 6. Source electrodes 12 have ground lines (not shown). A write line 10 is formed via an insulator at the side of each magnetoresistive film 9. The write lines 10, the gate electrodes 4, and the ground lines connected to the source electrodes run in a direction perpendicular to the page. The bit lines run in a direction parallel to the page. FIG. 9 is a plan view of the memory device configuration shown in FIG. 8.

Referring to FIG. 8, the magnetoresistive film 9 and the drain region 3 of the field-effect transistor are connected only by the plug 5. This eliminates problems such as a reduction of the recording magnetic field by the existence of a lower electrode, and disconnection of a line and a reduction of the fabrication margin during the process even when a lower electrode is thinned. This arrangement is readily achievable especially when the magnetic film forming the magnetoresistive film is a perpendicular magnetization film. Also, the arrangement can be realized with a simple process.

Additionally, when a perpendicular magnetization film is used, no spin curling is caused by the influence of a demagnetizing field even if the size of a memory device is decreased, so magnetization can be stably retained. When compared to a memory device using an in-plane magnetization film, therefore, the ratio of width/length of a TMR element can be decreased to 1, and consequently the memory cell area can be decreased. This makes it possible to miniaturize the memory or achieve a high integration degree. Accordingly, as shown in FIG. 9, the cell area can be decreased to a minimum of $4F \times 2F = 8F^2$.

Various arrangements of the magnetoresistive film have been proposed. This embodiment will be explained by taking particularly a spin tunneling effect film (TMR film) as an example. However, any magnetoresistive film can be used as long as the film achieves a magnetoresistive effect. A TMR film has a structure in which an insulating film as a nonmagnetic film is sandwiched between a soft layer having a small coercive force and a hard layer having a large coercive force. This film achieves a phenomenon in which the resistive value when a tunneling current flows with the magnetization directions of the two layers parallel to each other differs from that when a tunneling current flows with these magnetization directions antiparallel to each other. Examples of the magnetic layers are alloys of rare earth elements (RE) and iron family elements (TM). Practical examples are substances having an axis of easy magnetization perpendicular to the film plane, such as GdFe, GdFeCo, TbFe, TbFeCo, DyFe, and DyFeCo. In addition, PtCo, PdCo, and CoCr can also be used. Of these substances, rare earth-iron family alloys are preferred because they are amorphous at room temperature and hence do not produce grain boundary noise and the like, such as when a crystal is used, thereby reducing electrical noise.

As described above, the resistance in the stacking direction of the magnetoresistive film changes owing to the relative angle the magnetizations of the first and second magnetic films make. More specifically, the resistance is small when the magnetizations are parallel, and is large when they are antiparallel. The larger the difference between the state densities of "up" and "down" spins, the larger the resistive value, and the larger the reproduction signal. So, the magnetic films above and below the insulating film are desirably formed using magnetic materials having a high spin polarizability. For example, it is preferable to select Fe and Co, having large polarization amounts of upper and lower spins on the Fermi surface, as main components.

It is more favorable to sandwich a magnetic film, which has a large resistance change rate and magnetically couples with the first or second magnetic layer, between the first magnetic layer and the insulating layer and between the second magnetic layer and the insulating layer. Examples of this magnetic layer are Fe, Co, and FeCo. Magnetic coupling can be either exchange coupling or magnetostatic coupling, but the use of exchange coupling is preferred.

The film thickness of the magnetic layer is desirably 2 to 500 nm. This is so because especially when a memory device is microfabricated into a submicron order, the volumes of the first and second magnetic layers decrease, and the perpendicular magnetic anisotropic energy of each layer lowers accordingly, thereby reducing the magnetization retaining function of each layer. Since this . phenomenon is significant for a magnetic film less than 2 nm thick, the film thickness is desirably 2 to 5 nm. On the other hand, if the film thickness exceeds 500 nm, the cell resistive value increases too much. Therefore, the film thickness is favorably 500 nm or less, and more favorably, 100 nm or less.

When a spin tunneling film is used, a nonmagnetic layer must be an insulating layer in order for electrons to hold spins and tunnel. Either the whole or part of this nonmagnetic film can be an insulating layer. An example when an oxide of a nonmagnetic metal is used as an insulating layer is $Al_2O_3$ formed by oxidizing a portion of an Al film in the air or in a vacuum by plasma oxidation. Other examples are aluminum nitride $AlN_x$, silicon oxide $SiO_x$, silicon nitride $SiN_x$, and $NiO_x$, and aluminum oxide $AlO_x$ is preferred for the following reason. That is, in order for spin tunneling to occur, an appropriate potential barrier must be present in the energy of conduction electrons in the first and second magnetic layers. When $AlO_x$ is used, this barrier can be obtained with relative ease by a simple process.

Also, it is desirable that the film thickness of the layer be about a few nm and the film thickness of an insulating portion of the layer be 0.5 to 3 nm. If this film thickness is less than 0.5 nm, the first and second magnetic layers may electrically short. If the film thickness exceeds 3 nm, the electron tunneling phenomenon does not easily occur any longer. The film thickness is more preferably 1 to 2.5 nm.

Figure 10:
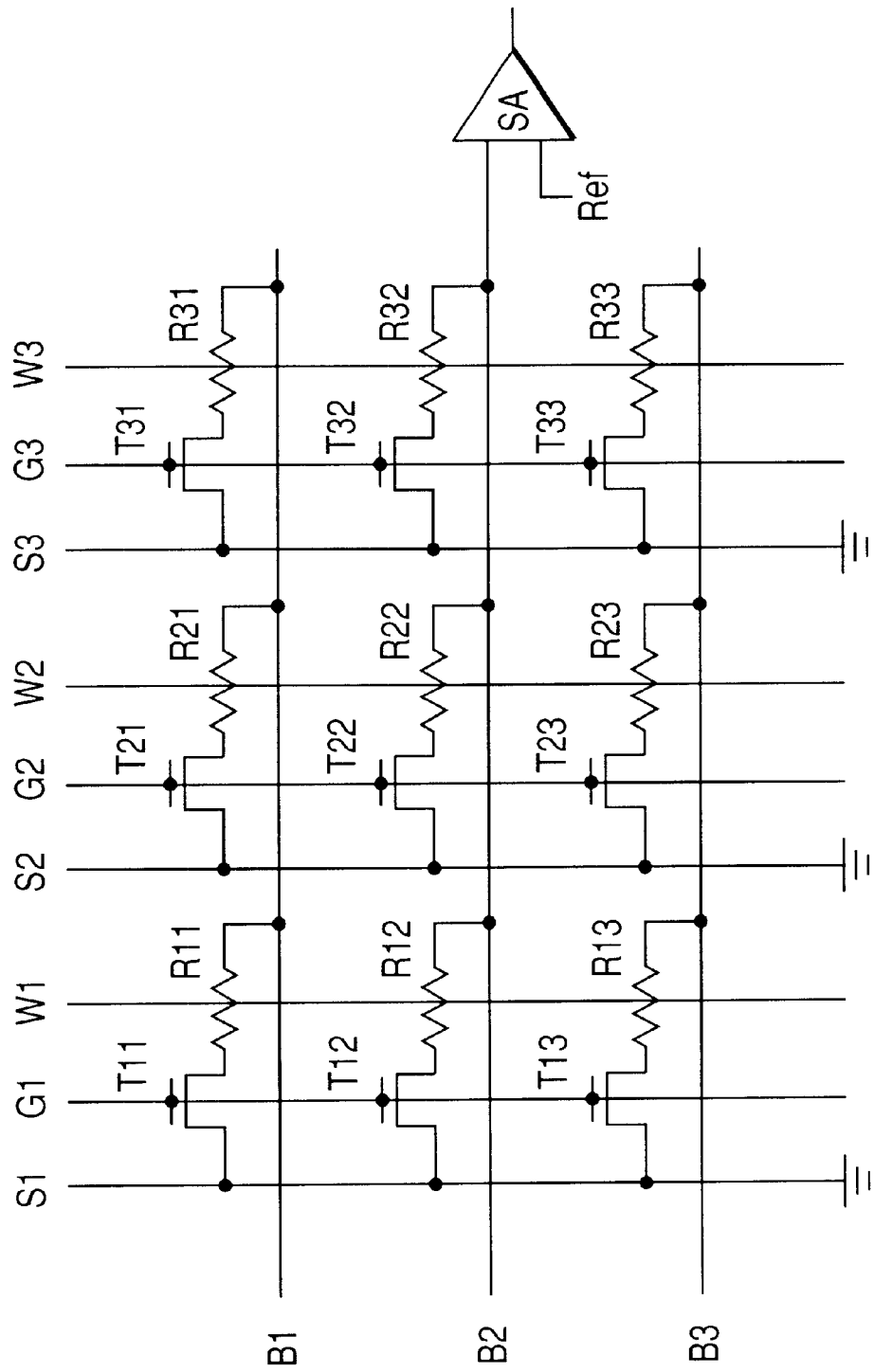
FIG. 10 is an equivalent circuit diagram showing an example of the circuit configuration of the memory of the first embodiment.

A recording/reproducing method of the present invention will be described below with reference to an equivalent circuit diagram shown in FIG. 10, in which memory cells are arranged in the form of a matrix. This equivalent circuit includes transistors T11 to T33, magnetoresistive films R11 to R33, bit lines B1 to B3, word lines (gate lines) G1 to G3, write lines W1 to W3, and source lines S1 to S3. When it is unnecessary to distinguish a certain component from others, its suffix will be omitted. In a memory cell made up of a transistor (T22) and a magnetoresistive film (R22), the bit line B2 also functions as a write line and is connected to one terminal of the magnetoresistive element (R22) of the cell and to one terminal of a sense amplifier (SA). The other terminal of the magnetoresistive element (R22) is connected to the drain terminal of the field-effect transistor (T22), and the source terminal of this field-effect transistor (T22) is grounded. A word line (G2) is connected to the gate terminal of the field-effect transistor (T22). A write line (W2) is placed near the magnetoresistive element R22 so as to perpendicularly cross the bit line.

First, a read operation will be explained. A power supply voltage Vdd is applied to the left-hand end of the bit line B2, and a voltage is applied to the word line G2 to turn on the transistor T22. Consequently, a steady-state current flows through the magnetoresistive element R22 to generate a potential, corresponding to the resistive value of the magnetoresistive element R22, at the terminal of the sense amplifier (SA) at the right-hand end of the bit line B2. To the other terminal of this sense amplifier SA, a potential equal to the intermediate value between the two resistive values of the magnetoresistive element R22 is input. Accordingly, Vdd or 0 V is selected as the output from the sense amplifier SA in accordance with which of Ref and R22 has a higher resistance.

Next, a method of writing desired magnetization in each cell will be described below. Although rewrite of only one of the two layers will be explained as an example, the magnetizations in the two layers can also be rewritten. Assuming that information is to be written into R22, an electric current is supplied to B2 and W2. Consequently, magnetic fields enhance each other at the intersection of these two lines, and this rewrites the magnetization in the soft layer (a ferromagnetic substance whose coercive force is weaker) of R22. When the direction of the current to W2 is reversed, a magnetic field in the opposite direction can be applied. Information is written by this operation. The write line is so placed that a magnetic field acts on the magnetoresistive film in a direction perpendicular to the film plane. An insulating film is formed between the write line and the magnetoresistive film, in order to prevent these write line and magnetoresistive film from being electrically connected. This is necessary to prevent the electrical current supplied to the magnetoresistive element during reproduction from leaking to the write line to thereby deteriorate the reproduction signal.

Also, if the distance between the write line and the magnetoresistive film is long, no sufficient magnetic field can be applied. If this distance is short, insulation breakdown occurs or a tunnel current flows between the write line and the magnetoresistive film. Therefore, the distance is at least 1 to 500 nm, and desirably, 5 to 100 nm.

The recording/reproducing method will be described in more detail with reference to FIG. 8. As described above, in a recording operation an electric current is supplied to the write line 10. A magnetic field generated from this write line 10 is used to align the magnetization in the magnetic layer of the magnetoresistive film 9 in accordance with information, thereby recording the information. The electric current flows through the write line 10 in a direction perpendicular to the page. For example, when an electric current is allowed to flow in a direction pointing into the page, a magnetic field is generated clockwise with respect to the write line. In this case, an "up" magnetic field component is applied to the magnetoresistive film 9. An electric current is supplied to the bit line simultaneously with the write line. Magnetic fields from these write line and bit line are applied to a plurality of memory cells. However, a synthetic magnetic field from the write line and bit line is applied only to a magnetoresistive film at the intersection of the conductors to which the electric currents are supplied. Accordingly, information can be recorded only in a predetermined memory cell. An "up" or "down" magnetic field is applied to the magnetoresistive film in accordance with the direction of an electric current supplied to the write line. Therefore, the magnetization state of the magnetoresistive film can be determined in accordance with information.

Read methods are roughly classified into two methods: an absolute detection method and a differential detection method. The absolute detection method will be explained first. In this absolute detection, the arrangement of the magnetoresistive film is "memory layer (first magnetic layer)/nonmagnetic layer/pin layer (second magnetic layer)". The first magnetic layer is a memory layer for storing magnetized information. The second magnetic layer is a pin layer in which magnetization is oriented in a predetermined fixed direction in any of storage, recording, and reproduction. For example, data "0" and "1" are made to correspond to "up" magnetization and "down" magnetization, respectively, in the first magnetic layer. As described previously, information is recorded by reversing the magnetization in the first magnetic layer by using a magnetic field generated by an electric current supplied to the write line. The resistive value is small when data is "0" and large when data is "1". During reproduction, therefore, information can be detected by the absolute value of the resistance, without reversing the magnetization in the magnetic layer. Since no magnetization reversal need be performed to detect changes in the resistive value during reproduction, reproduction can be performed at high speed with small current consumption.

In the above description, the spin direction in the second magnetic layer is "up". However, this spin direction can also be "down". Also, data "0" and "1" can be made to correspond to "down" magnetization and "up" magnetization, respectively, in the first magnetic layer. Furthermore, the above-mentioned rare earth-iron family alloy (RE-TM) materials can be used as the magnetic materials of both the first and second magnetic layers. However, the second magnetic layer as a pin layer is particularly preferably made of TbFe, TbFeCo, DyFe, or DyFeCo, each having a high coercive force. If the coercive force of the first magnetic layer is too low, the memory performance degrades; if this coercive force is too low, the recording electric current increases. Hence, the coercive force of the first magnetic layer is desirably 5 to 50 Oe. If the coercive force of the second magnetic layer is too low, magnetization reversal may occur during recording/reproducing; if this coercive force is too high, initialization by which spins are oriented in one direction is difficult to perform. Therefore, the coercive force of the second magnetic layer is desirably 20 Oe to 20 kOe. Also, the coercive force of the first magnetic layer is preferably about half that of the second magnetic layer.

The differential detection method will be described next. In this differential detection, the arrangement of the magnetoresistive film is "detection layer (first magnetic layer)/ nonmagnetic layer/memory layer (second magnetic layer)". The second magnetic layer is a memory layer for storing magnetized information. The first magnetic layer having a small coercive force is a layer for reading out magnetized information stored in the second magnetic layer by using a magnetoresistive effect. For example, data "0" and "1" are made to correspond to "up" magnetization and "down" magnetization, respectively, in the second magnetic layer. Information is recorded by reversing the magnetization in the second magnetic layer by using a magnetic field generated by a recording electric current.

In reproduction, an electric current weaker than the recording electric current is supplied to the write line. Alternatively, two write lines are formed, and an electric current is supplied to one of these write lines. In this manner, a magnetic field smaller than the recording magnetic field is generated, and only magnetization in the detection layer is reversed without reversing magnetization in the memory layer. Since a resistive value "0" changes from small to large and a resistive value "1" changes from large to small, recorded information can be detected by this resistive value change. This method can detect a slight signal change by using a differential detection method or the like, compared to the method which detects the absolute value of the resistive value. Accordingly, data can be reproduced with high detection sensitivity.

Data "0" and "1" can also be made to correspond to "down" magnetization and "up" magnetization, respectively, in the second magnetic layer. RE-TM materials can be used as the magnetic materials of both the first and second magnetic layers. Since, however, magnetizations in both the first and second magnetic layers are reversed, materials having a low coercive force such as GdFe and GdFeCo are desirable. If the coercive force of the first magnetic layer is too low, the reproduction signal deteriorates; if this coercive force is too high, the reproducing electric current increases. Therefore, the coercive force of the first magnetic layer is preferably 2 to 20 Oe. If the coercive force of the second magnetic layer is too low, the memory performance degrades; if this coercive force is too high, the recording electric current rises. Hence, the coercive force of the second magnetic layer is desirably 5 to 50 Oe. Also, the coercive force of the first magnetic layer is preferably about half that of the second magnetic layer. In the above description, the source electrode is a ground line at the ground potential. However, this source electrode need not be set at the ground potential but can be set at any arbitrary potential.

An example of the fabrication process of the memory device of the present invention will be described below with reference to FIGS. 11 to 15. A substrate including MOS (Metal-Oxide-Semiconductor)-FETS (Field-Effect Transistors) as shown in FIG. 11 is prepared. First, plug electrodes 5 are formed in a drain region 3 of the FETS of this substrate (FIG. 12). The substrate also includes element isolation regions 11 such as LOCOS. After the upper surface is planarized, an AlCu layer is formed as an underlayer, and a GdFe/Co/AlO$_x$/Co/TbFe stacked film is formed as a magnetoresistive element (FIG. 13). The resultant structure is processed by photolithography, an SlO$_2$ film is formed by plasma CVD, and the upper surface is planarized (FIG. 14).

Figure 15:
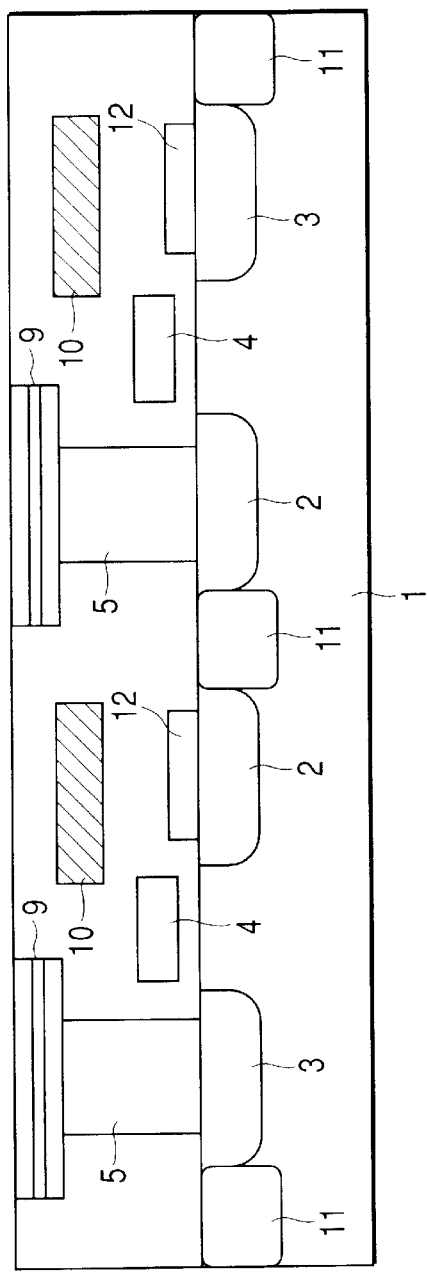
FIG. 15 is a sectional view showing the fabrication process of the memory of the first embodiment.

Next, a Ti/AlSiCu/Ti layer is formed and processed by photolithography as write lines, an SiO$_2$ film is formed as a dielectric interlayer by plasma CVD, and the upper surface is planarized (FIG. 15). A Ti/AlSiCu/Ti layer is again formed and processed by photolithography as bit lines, an SiO$_2$ film is formed as a dielectric interlayer by plasma CVD, and an SiN film is formed as a protective layer. In this way, the memory device shown in FIG. 8 is completed.

In the memory device of the present invention as described above, the magnetoresistive film is positioned immediately above the drain region, so it is unnecessary to etch this magnetoresistive film and leave the lower electrode. This eliminates the problem of a lowering of the yield caused by variations in the etching stop position.

It is also unnecessary to selectively form a portion where both the magnetoresistive film and the lower electrode are removed, and a portion where the lower electrode is left behind. This reduces the number of mask steps and simplifies the process.

Second Embodiment

Figure 16:
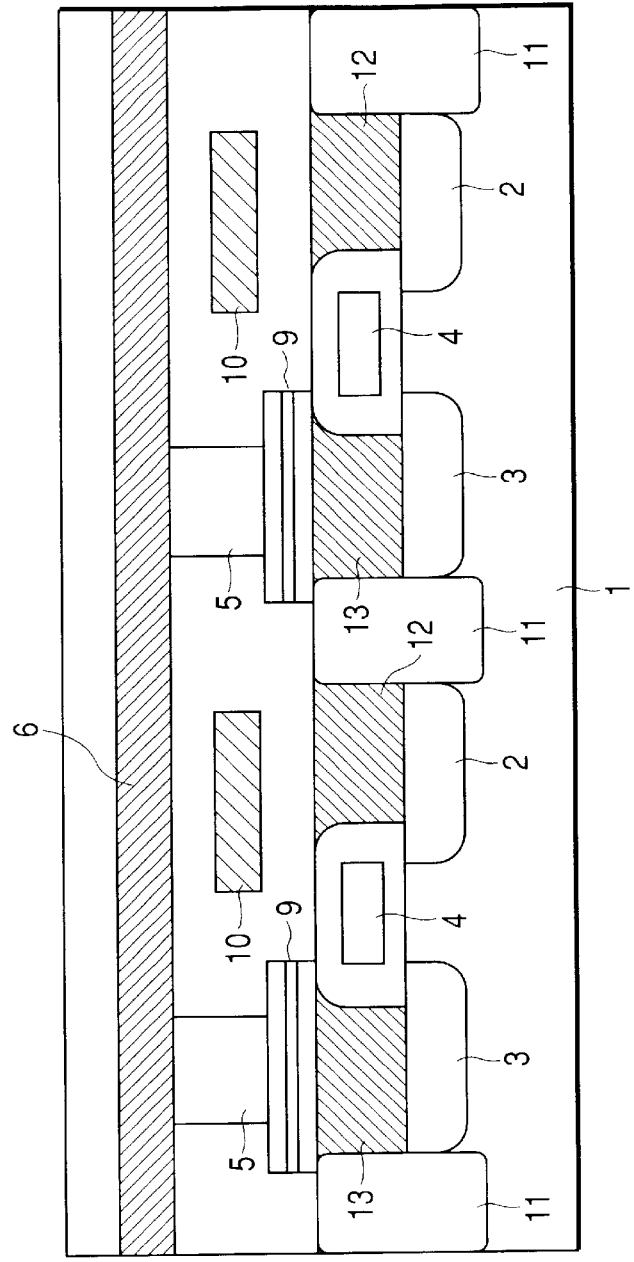
FIG. 16 is a sectional view of a memory of the second embodiment.
Figure 17:
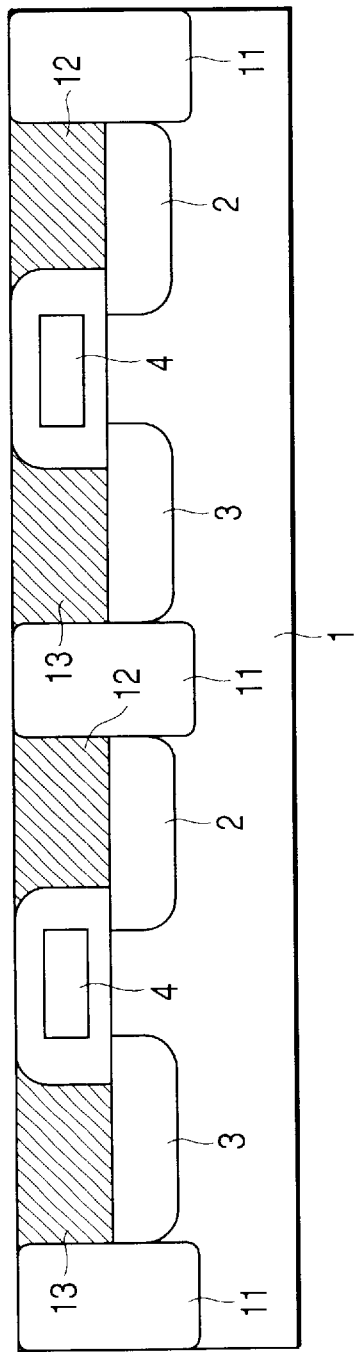
FIG. 17 is a sectional view showing the fabrication process of the memory of the second embodiment.
Figure 18:
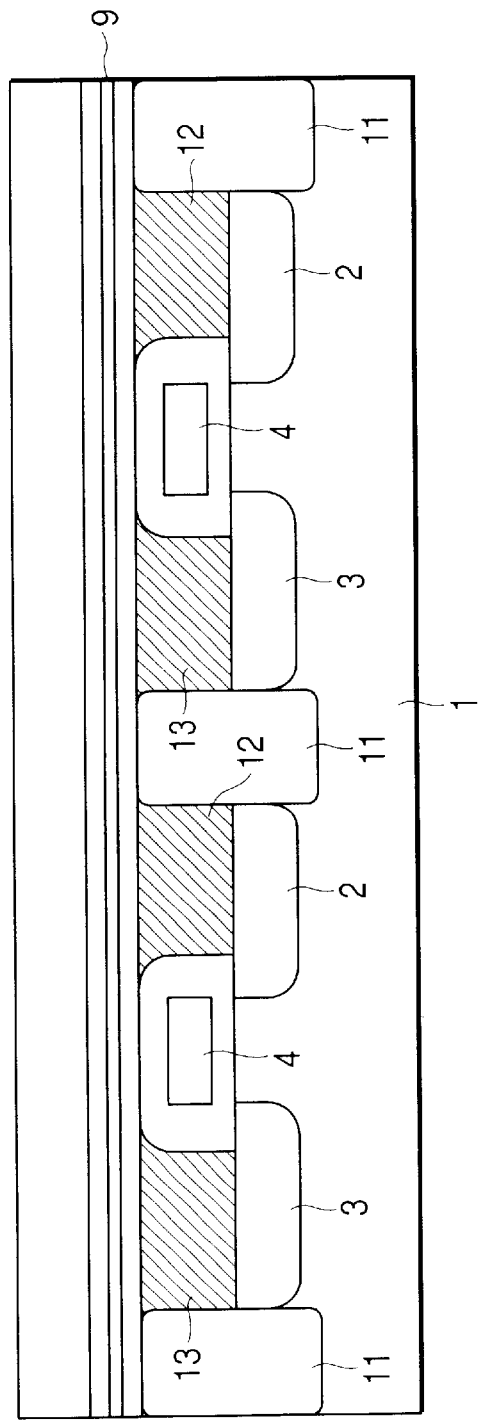
FIG. 18 is a sectional view showing the fabrication process of the memory of the second embodiment.
Figure 19:
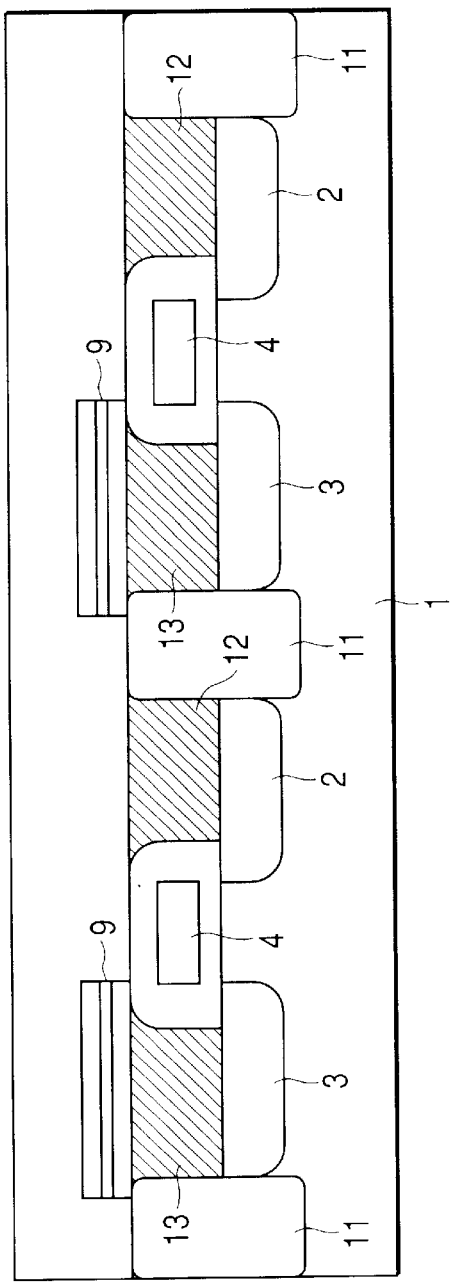
FIG. 19 is a sectional view showing the fabrication process of the memory of the second embodiment.
Figure 20:
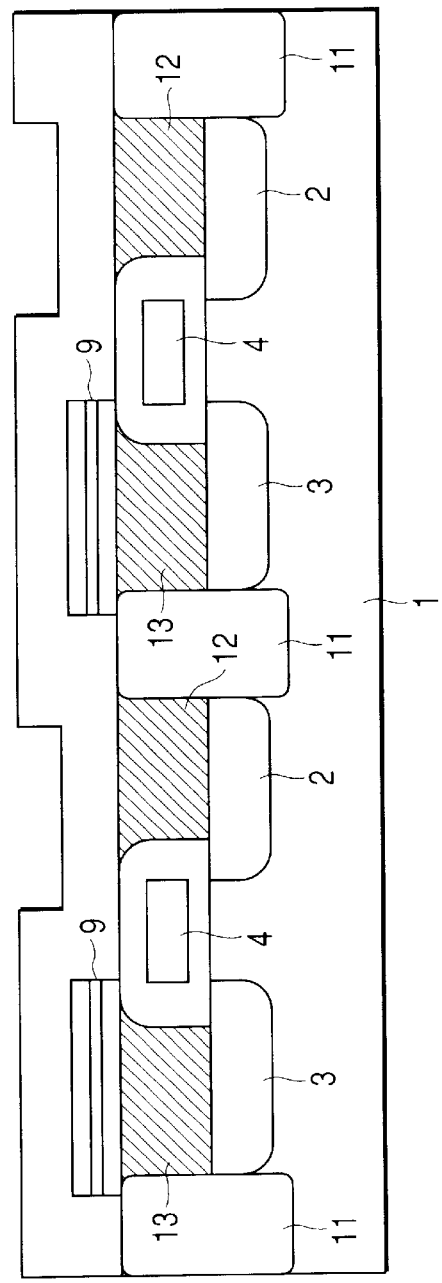
FIG. 20 is a sectional view showing the fabrication process of the memory of the second embodiment.
Figure 21:
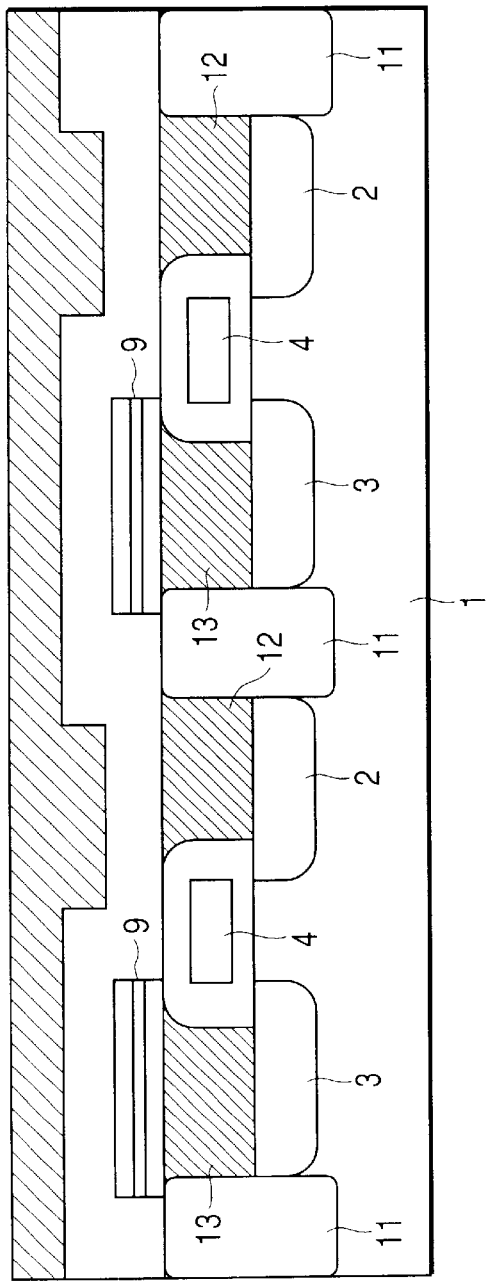
FIG. 21 is a sectional view showing the fabrication process of the memory of the second embodiment.
Figure 22:
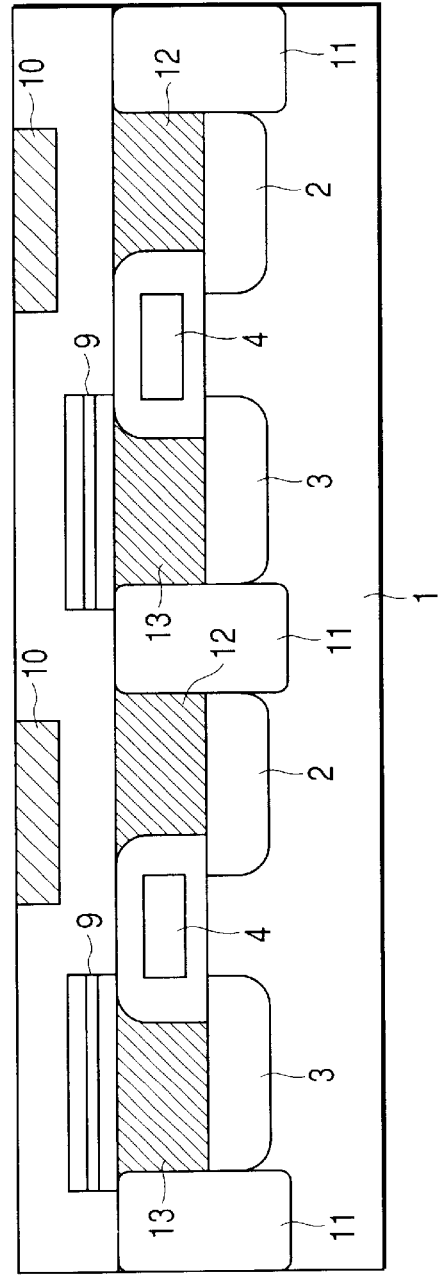
FIG. 22 is a sectional view showing the fabrication process of the memory of the second embodiment.
Figure 23:
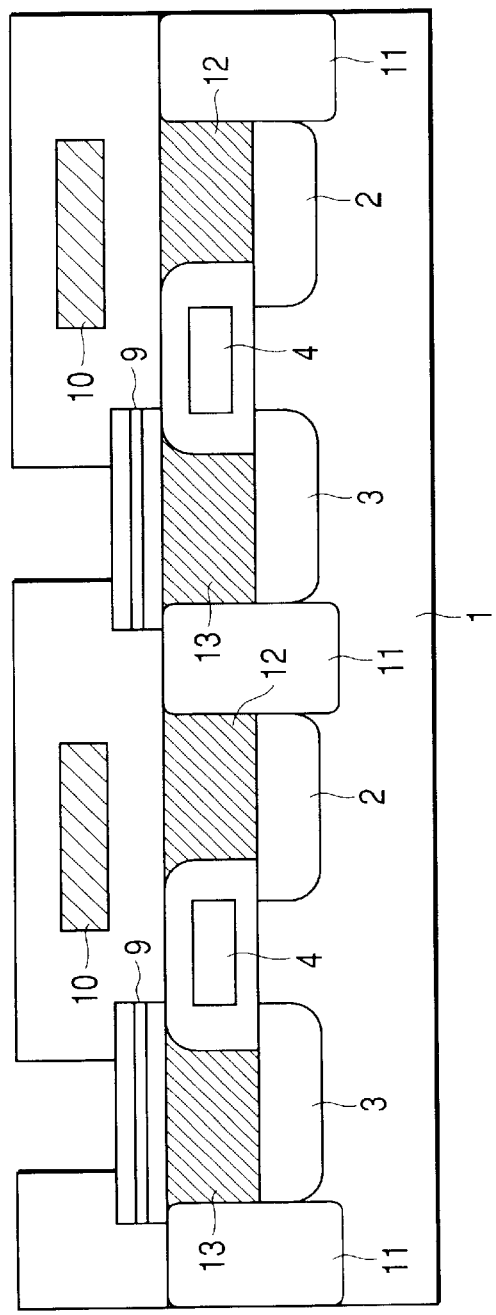
FIG. 23 is a sectional view showing the fabrication process of the memory of the second embodiment.
Figure 24:
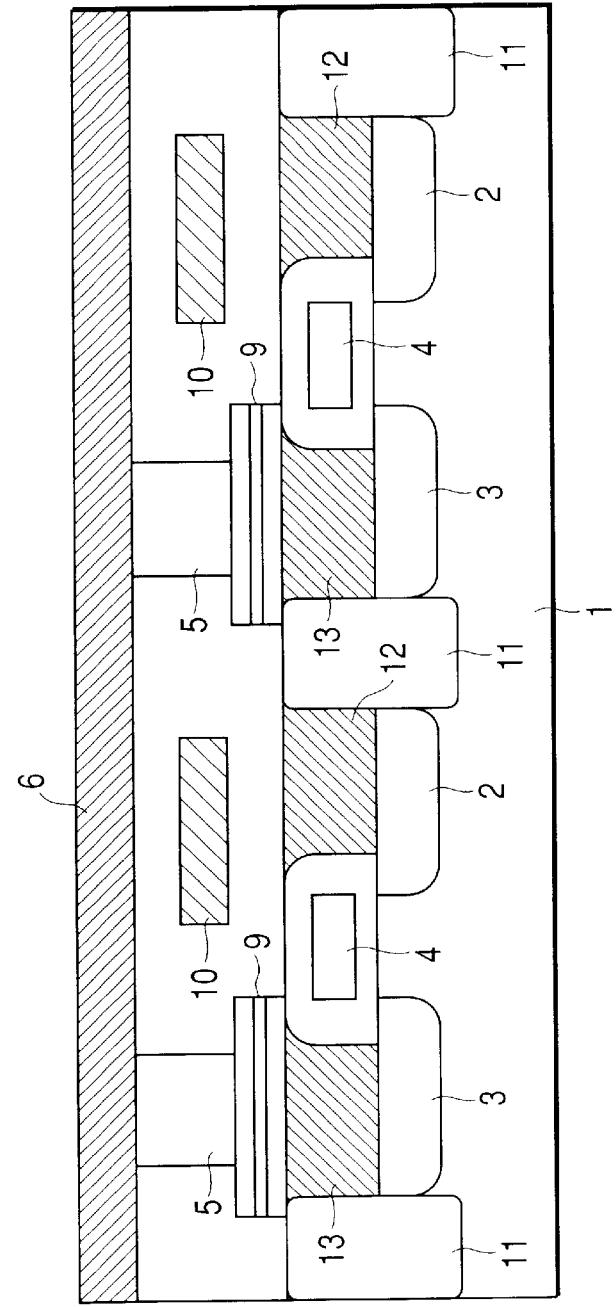
FIG. 24 is a sectional view showing the fabrication process of the memory of the second embodiment.

FIG. 16 is a sectional view of a memory device structure of the present invention used in this embodiment. In this embodiment, a drain electrode is formed in self alignment, and a magnetoresistive film is directly formed on this drain electrode. A fabrication process of this embodiment is shown in FIGS. 17 to 24. First, drain electrodes 13 and source electrodes 12 of field-effect transistors are formed in self alignment between gate electrodes 4 covered with an insulating film and shallow trench isolation regions 11 and are planarized by CMP or the like (FIG. 17). After that, a GdFe/Co/AlO$_x$/Co/TbFe magnetoresistive film which is a stacked film whose magnetization is oriented in a direction perpendicular to the film plane is formed (FIG. 18) and patterned, and an insulating film is formed (FIG. 19). This insulating film is partially removed (FIG. 20), a metal film such as Cu film is buried (FIG. 21), and the surface is planarized by CMP to form write lines 10 (FIG. 22). Subsequently, holes are formed in the insulating film above the magnetoresistive film (FIG. 23), and plugs 5 are buried. A bit line 6 is then formed (FIG. 24), and an insulating film is formed as a protective film (FIG. 16).

Referring to FIG. 8, if the alignment difference is F (a minimum fabrication dimension) when the plug electrode 5 is formed on the drain region 3, a width of 3F is necessary, so the area of the drain region 3 must be $9 \times F^2$. In contrast, in the device structure of this embodiment, the drain electrode 13 can be formed in self alignment, and this obviates the need for any alignment margin. Since the alignment margin between the drain region 3 and the drain electrode 13 can be 0 in principle, the area of the drain region 3 can be $1 \times F^2$, i.e., further miniaturization can be achieved. Also, in this memory device, an area occupied by the drain electrode in the area of the drain region can be 50% or more. Therefore, it is possible to decrease the area of the memory device and further decrease the cell area. The ratio of the area of the drain electrode to the area of the drain region is preferably 60% or more, and more preferably, 80 to 90% because the memory device can be further miniaturized.

Furthermore, the magnetoresistive film 9 need only be electrically connected to the drain electrode 13 without being electrically connected to the adjacent source electrode 12, and is formed after the surface is planarized by CMP. This realizes a certain alignment margin and can thereby suppress the adverse effect of the roughness of a tunnel barrier film. The compositions of the magnetic layers and an information recording/reproducing method can be the same as in the first embodiment. This similarly applies to the following embodiments.

Third Embodiment

Figure 25:
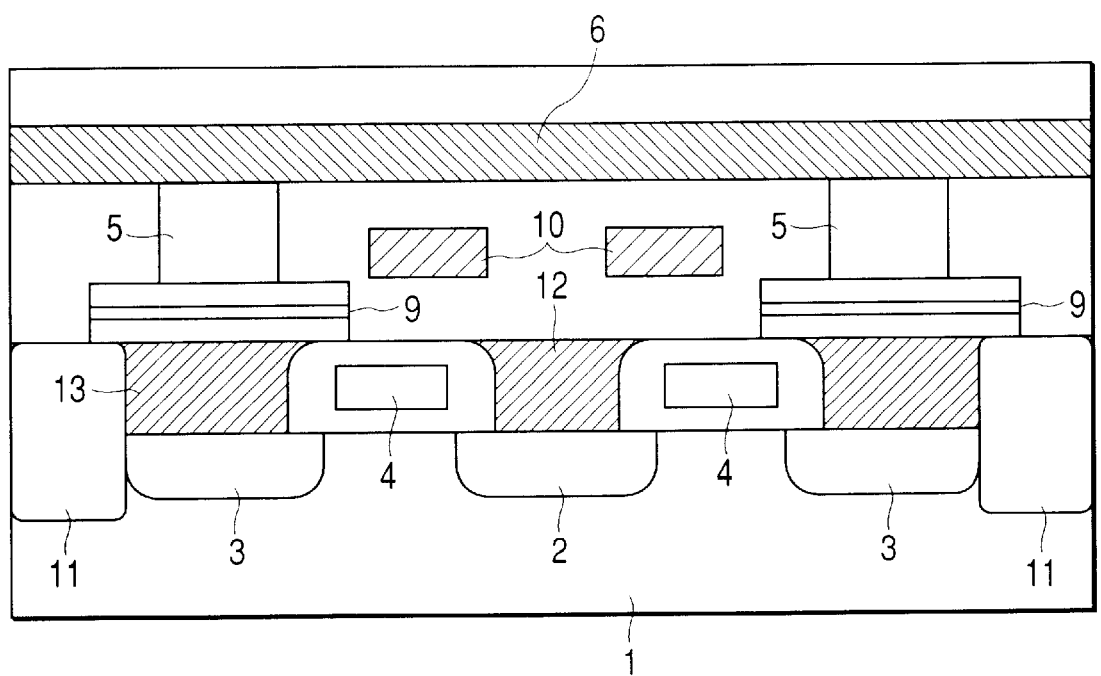
FIG. 25 is a sectional view of a memory of the third embodiment, in which a source line (ground line) is shared by adjacent elements.
Figure 26:
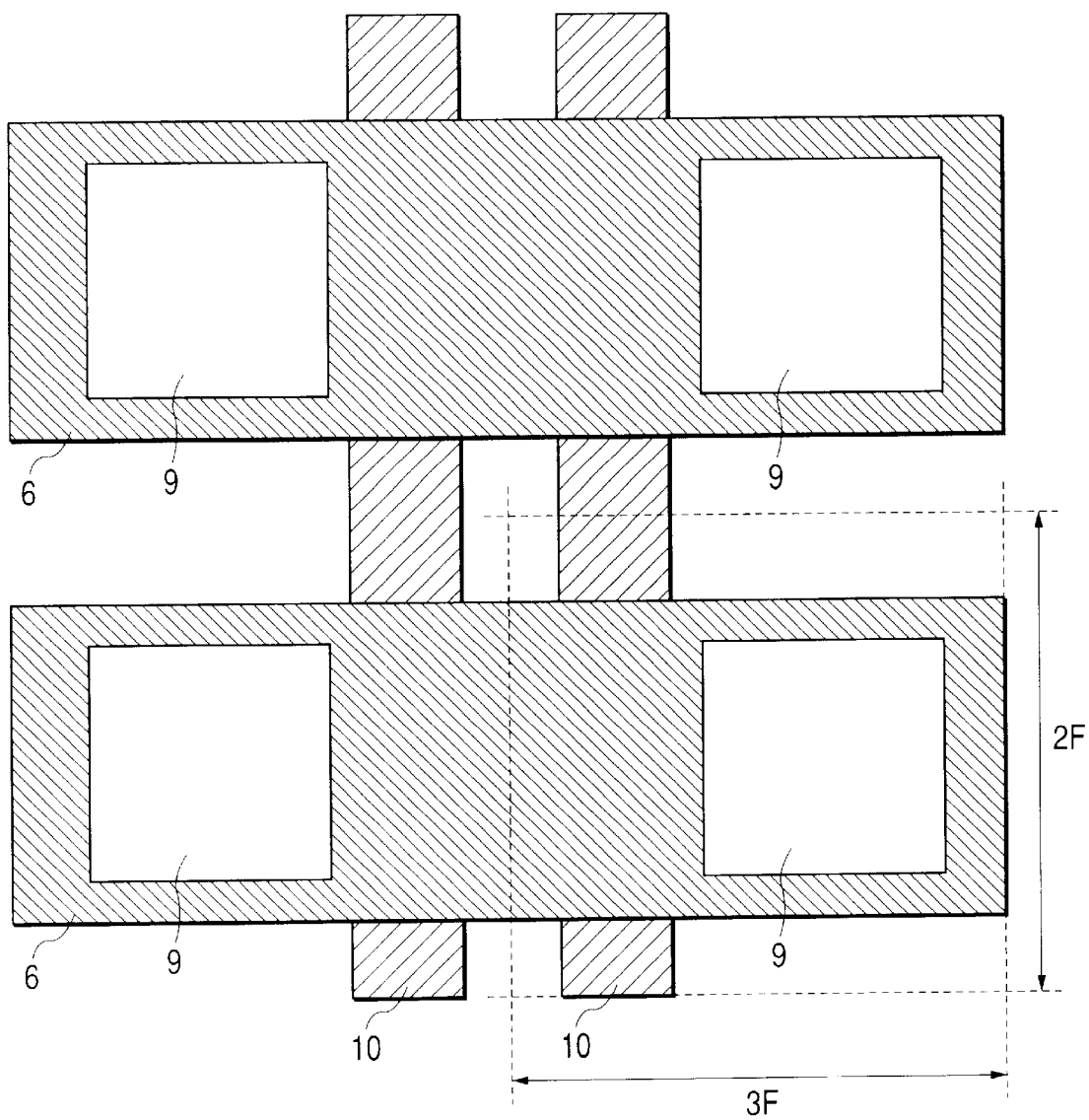
FIG. 26 is a plan view of the memory device shown in FIG. 25.
Figure 27:
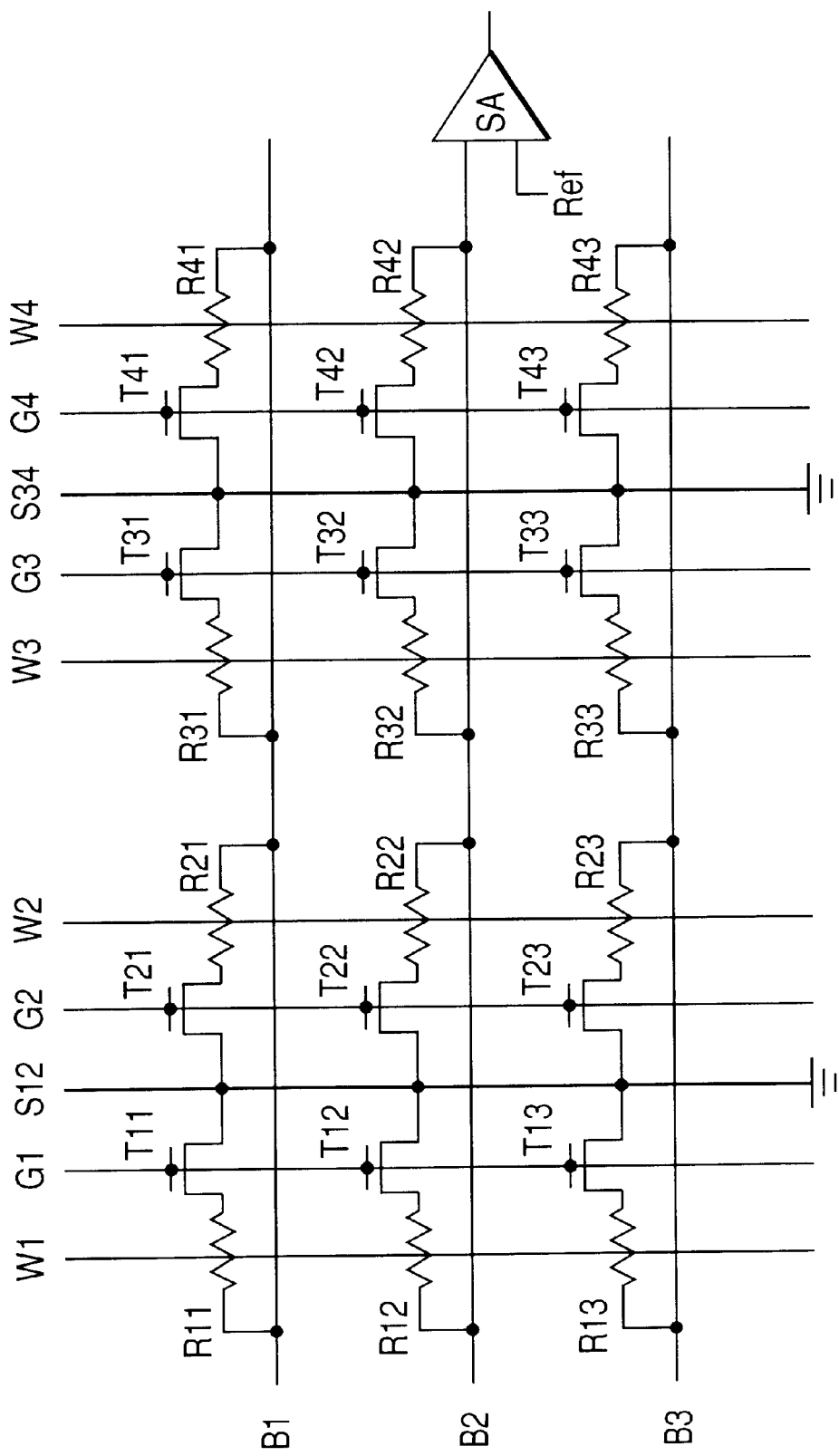
FIG. 27 is an equivalent circuit diagram showing the circuit configuration of the memory shown in FIG. 25.

FIG. 25 shows the structure of a memory of the present invention used in this embodiment. This embodiment has a structure in which a ground line is shared by adjacent memory devices. Referring to FIG. 25, the source region of a memory cell is at the ground potential. In this embodiment, the cell area can be decreased because the source region of a MOSFET is shared by adjacent memory cells. The width in the lateral direction of the memory cell can be decreased to 3F (F is a minimum fabrication dimension), and the area of the memory cell can be decreased to $6 \times F^2$. A plan view and an equivalent circuit diagram of this embodiment are shown in FIGS. 26 and 27, respectively. Also, the same reference numerals as in FIGS. 8 to 10 denote parts having the same functions, and a detailed description thereof will be omitted.

Fourth Embodiment

FIG. 28 shows the structure of a memory of the present invention used in this embodiment. In this embodiment, two parallel write lines are formed on the two sides of each magnetoresistive element, and electric currents are allowed to flow through these write lines in opposite directions. A large magnetic field can be applied by synthesizing the generated magnetic fields. When a magnetic field weaker than a recording magnetic field must be generated during reproduction, an electric current is supplied to one write line in reproduction and to the two write lines in recording. Since this can widen the current margin between reproduction and recording, the memory can stably operate without any recording error during reproduction.

Fifth Embodiment

FIG. 29 shows the structure of a memory of the present invention used in this embodiment. This embodiment has a structure in which a write line 10 is shared by adjacent cells. Since each write line 10 is shared, the number of lines decreases, and this simplifies the device structure. Consequently, a memory device can be miniaturized.

Sixth Embodiment

Figure 30:
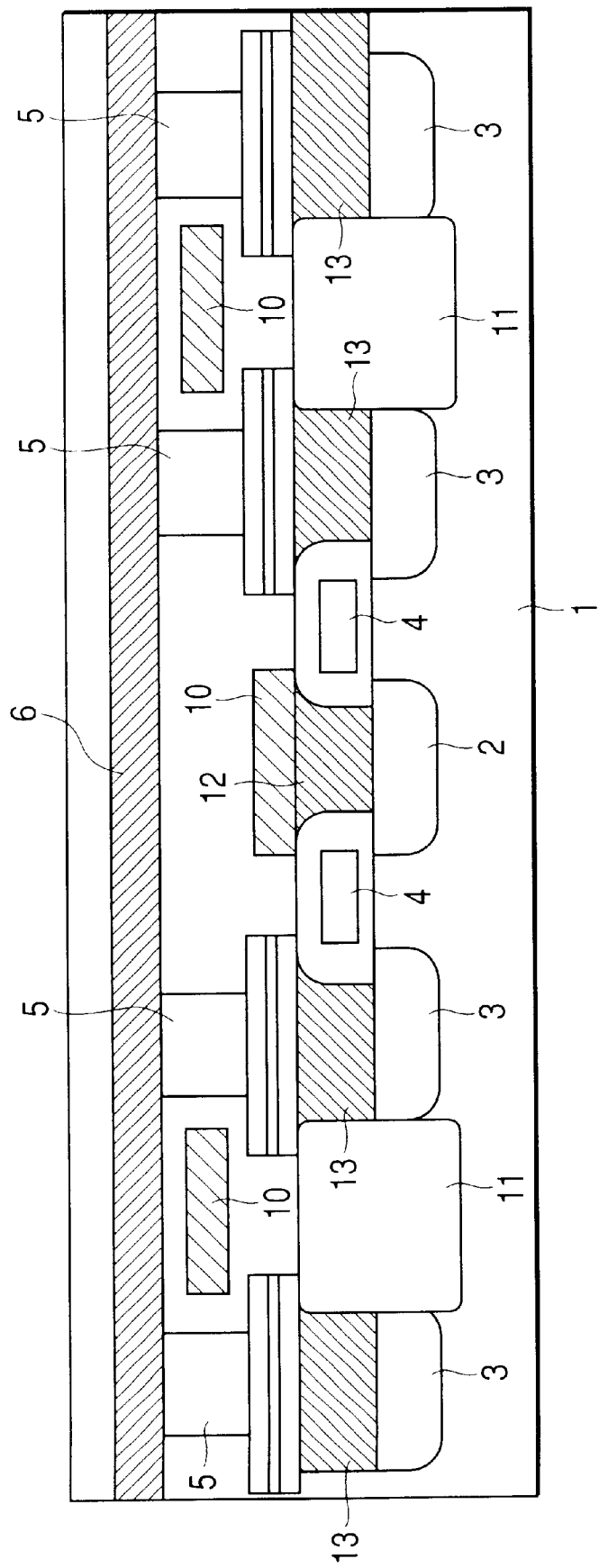
FIG. 30 is a sectional view of a memory of the sixth embodiment, in which a write line is formed on a source region.

FIG. 30 shows the structure of a memory of the present invention used in this embodiment. In this embodiment, a write line 10 is formed on a source electrode 12 to also function as a ground line. This simplifies both the device structure and the fabrication process. In performing a recording/reproducing operation by supplying an electric current to the write line, it is desirable not to supply the current to transistors. To this end, the potential of the gate electrode is so set that transistors on the two sides are turned off.

Seventh Embodiment

Figure 31:
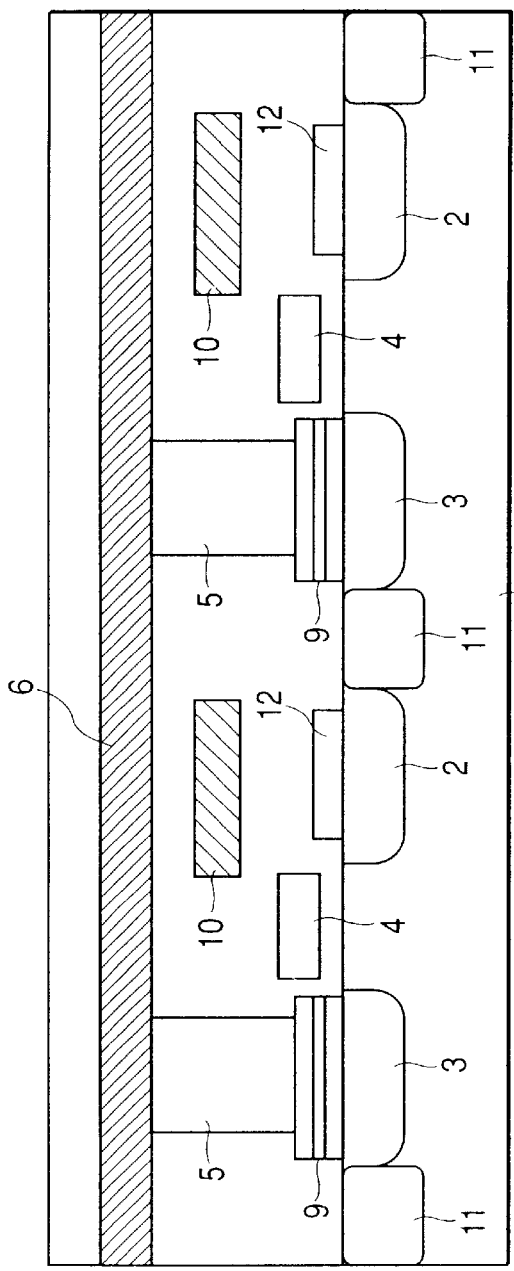
FIG. 31 is a sectional view of a memory of the seventh embodiment, in which an element is directly formed on a drain region.
Figure 32:
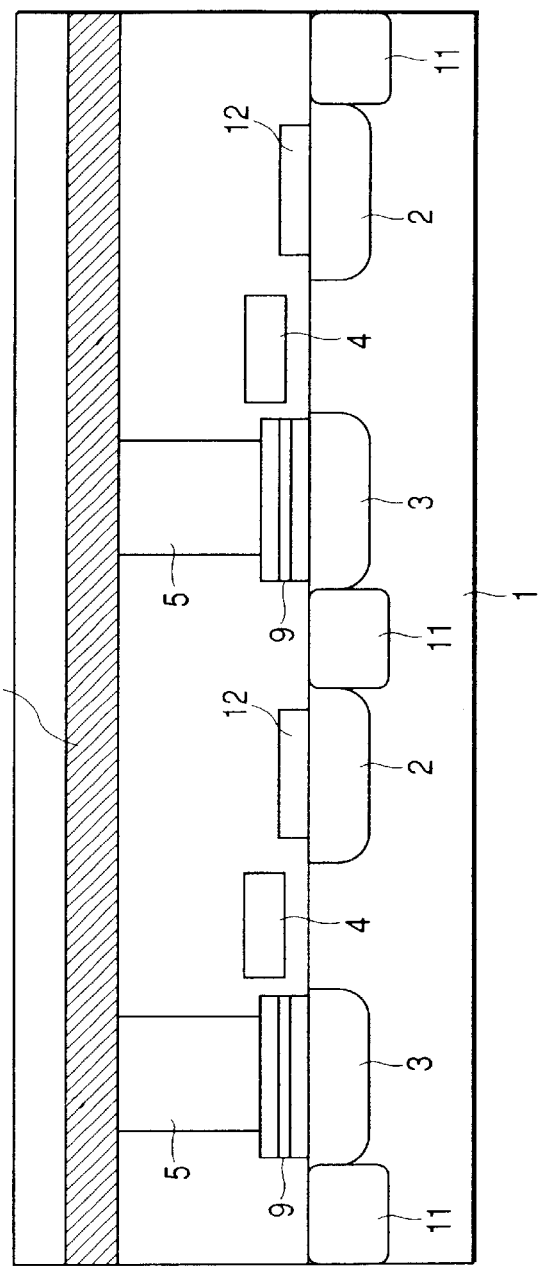
FIG. 32 is a sectional view of a memory of the seventh embodiment, in which a write line and a gate line are integrated.

FIGS. 31 and 32 show the structure of a memory of the present invention used in this embodiment. In this embodiment, a magnetoresistive film 9 is directly connected to a drain region without any plug and drain electrode between them. When a magnetoresistive film is formed immediately above a drain region as in the structure of this embodiment, it is unnecessary to form a plug or drain electrode between them. FIG. 32 is a view showing a structure in which gate electrodes 4 are also used as write lines 10. In this embodiment, when an electric current is supplied to a write line, the potential of the gate electrode must be suppressed to a voltage at which the field-effect transistor is not turned on. For this purpose, the resistivity of the gate electrode need only be reduced such that the potential of the gate electrode does not excessively rise when an electric current required for data write is supplied.

Eighth Embodiment

Figure 33:
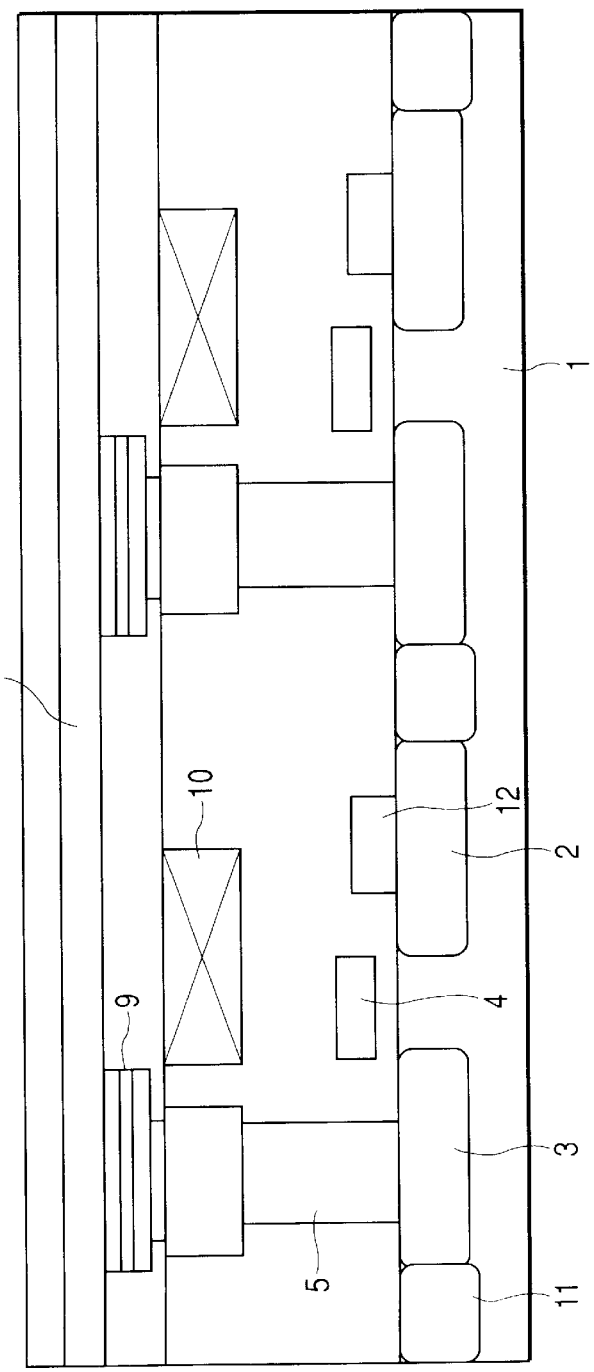
FIG. 33 is a sectional view of a memory of the eighth embodiment, in which write lines are formed closer to a substrate than elements.

FIG. 33 is a schematic sectional view of a memory device in which a write line is formed closer to a substrate than a magnetoresistive effect element. The same reference numerals as in FIG. 1 denote parts having the same functions. A difference from FIG. 8 is that a write line 10 is formed closer to a substrate than a magnetoresistive effect element 9.

An electric current flowing through the write line 10 generates a magnetic field perpendicular to the magnetoresistive effect element 9. Therefore, the most effective position is one just beside the magnetoresistive effect element. Since, however, in this case a write line is buried after a magnetoresistive effect element is formed, a large space is necessary for alignment in order to avoid an electrical short circuit between the magnetoresistive effect element 9 and the write line 10. This separates the magnetoresistive effect element 9 and the write line 10 from each other, so a magnetic field applicable to the magnetoresistive effect element 9 decreases for the same write electric current. In addition, to supply a large write electric current, the sectional area of the write line must be increased. A thick line is buried by removing metals formed in unnecessary portions by chemical mechanical polishing (CMP). However, stress acts in this CMP step, so a buffering layer or the like must be inserted to avoid the influence on the magnetoresistive effect element.

Figure 34:
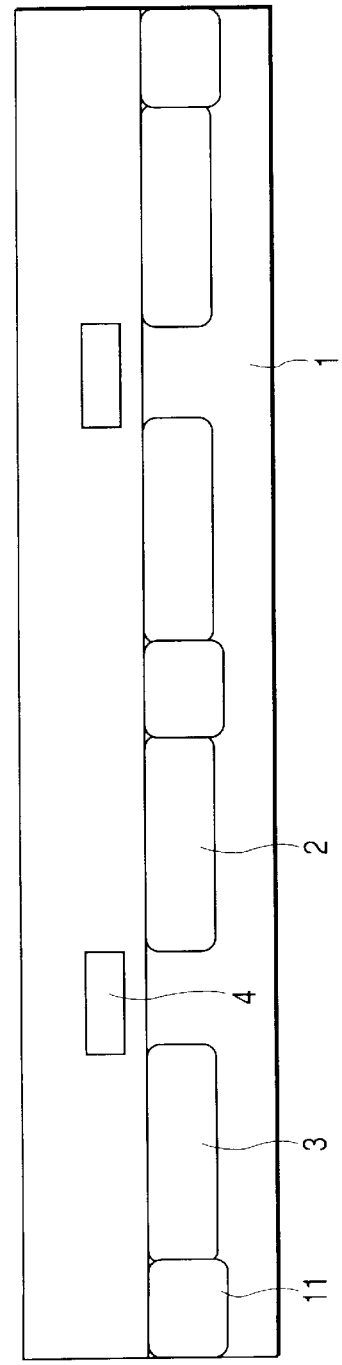
FIG. 34 is a sectional view showing the fabrication process of the memory of the eighth embodiment.
Figure 35:
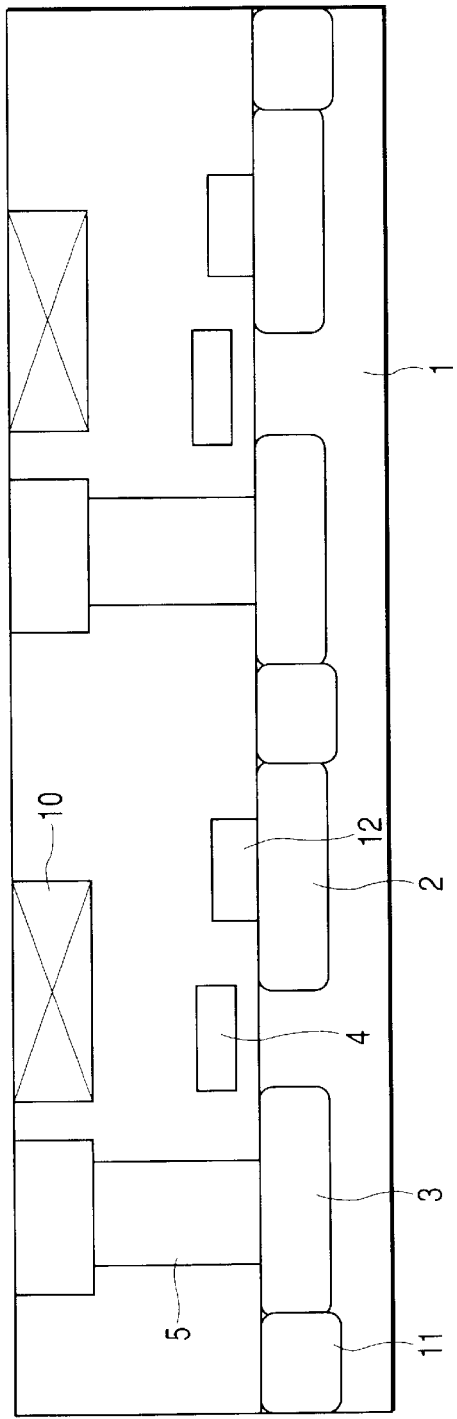
FIG. 35 is a sectional view showing the fabrication process of the memory of the eighth embodiment.

The fabrication steps of the structure of this embodiment will be explained below. FIG. 34 shows a silicon substrate in which field-effect transistors are formed by using a conventional silicon process. Plug electrodes 5 connecting to drain regions 3 of these field-effect transistors and write lines 10 are formed, and the upper surface is planarized (FIG. 35). All materials used up to this step are materials used in the silicon process, so contamination of the process apparatuses and a heat resistance to annealing are of no problem. Therefore, general-purpose apparatuses and processes can be used in the fabrication.

Figure 36:
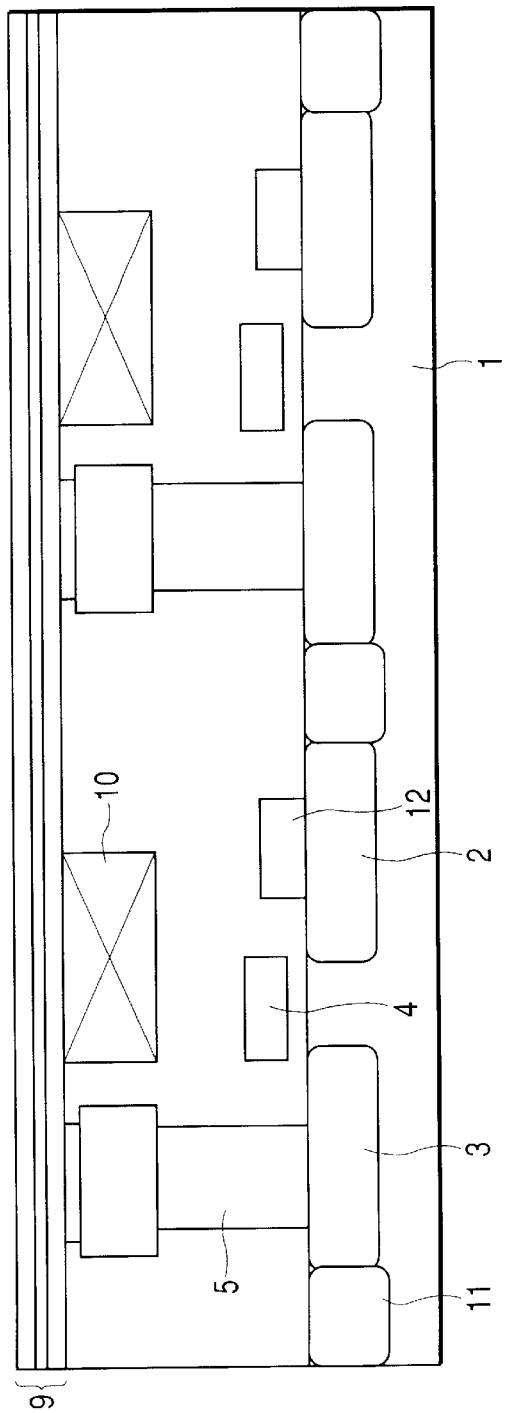
FIG. 36 is a sectional view showing the fabrication process of the memory of the eighth embodiment.

Subsequently, contact holes are formed immediately above the plugs, and a magnetoresistive effect film is stacked (FIG. 36). After magnetoresistive effect elements are fabricated by photolithography, an insulating film is further formed. Contact holes are formed immediately above these magnetoresistive effect elements, and a bit line electrode material is formed and processed by photolithography. Finally, an insulating film serving as a protective layer is formed to complete the device shown in FIG. 33.

The steps pertaining to this magnetoresistive effect material are primarily the formation and patterning of the magnetoresistive effect film and the formation and patterning of bit lines 6. So, the device can be fabricated by relatively small numbers of process steps and apparatuses. Furthermore, since the magnetoresistive effect element and the write line can be formed close to each other, a magnetic field induced by a write electric current can be effectively applied to the magnetoresistive effect element.

That is, the arrangement of this embodiment makes it possible to fabricate the memory device with relative ease and effectively apply a magnetic field induced by the write line to the magnetoresistive effect element.

Ninth Embodiment

FIGS. 37 and 38 are schematic sectional views of memory cells in which write lines 10 are formed, via an insulating film, on element isolation regions 11 and gate electrodes 4, respectively, of field-effect transistors formed in a silicon substrate. The same reference numerals as in FIGS. 1 and 33 denote parts having the same functions. A plug 5 connecting to a drain region 3 of the field-effect transistor and the write line 10 match the pattern of the field-effect transistor. Hence, effects of facilitating mask pattern formation and mask alignment in the fabrication process can be expected.

Figure 39:
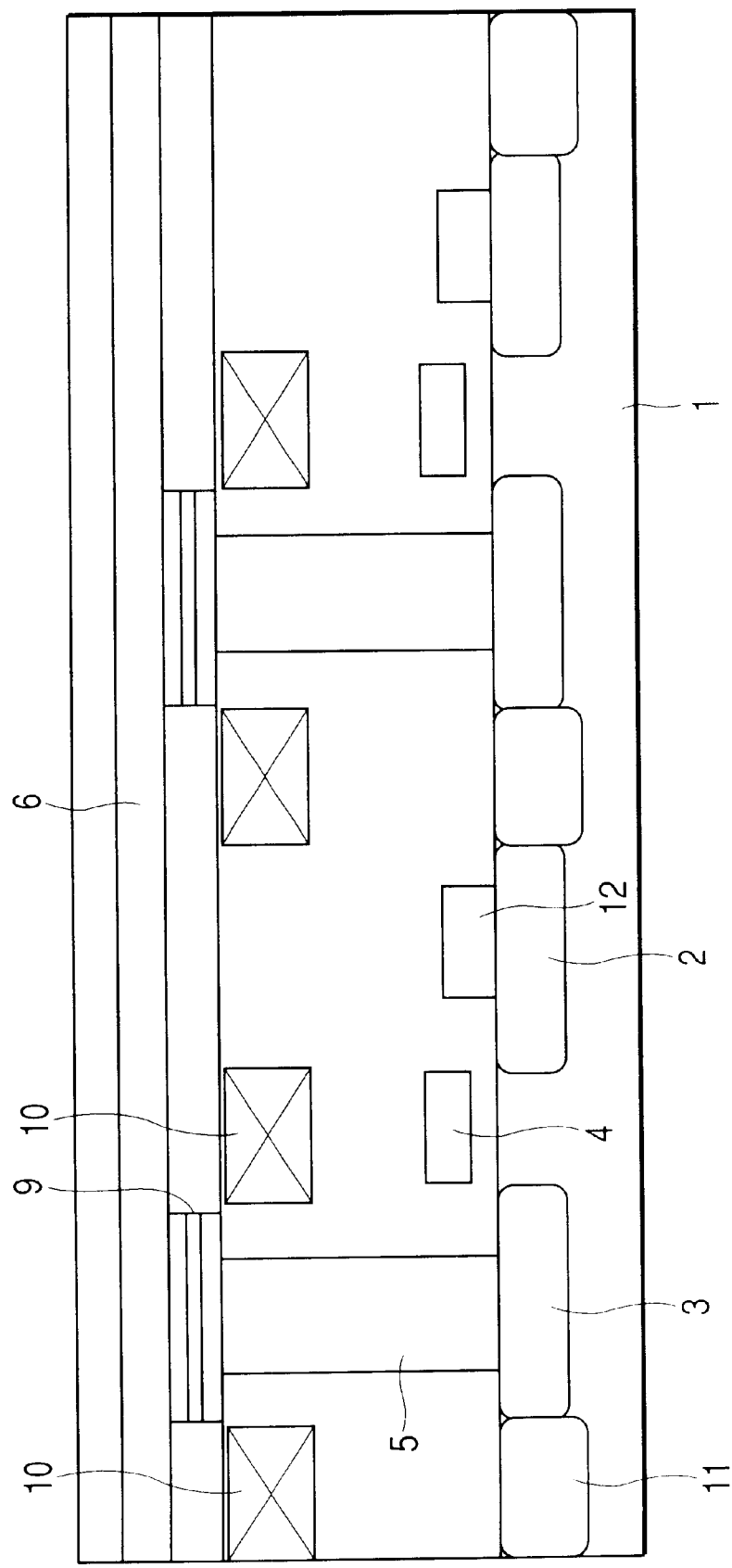
FIG. 39 is a sectional view of a memory of the ninth embodiment, in which two write lines are formed on the two sides of a memory device, and these two write lines are formed on an element isolation region and/or a gate electrode.

FIG. 39 is a schematic sectional view of memory cells in which two write lines 10 are formed on the two sides of each magnetoresistive effect element, such that these write lines 10 are formed, via an insulating layer, on an element isolation region and a gate electrode 4 of the field-effect transistor formed in a silicon substrate. The memory can be miniaturized by this arrangement.

What is claimed is:

1. A memory comprising:
   a magnetoresistive element on a substrate which has a structure in which first and second magnetic layers are stacked, and a nonmagnetic layer is sandwiched between said first and second magnetic layers;
   a write line which generates a magnetic field under an electric current and applies the magnetic field to the magnetoresistive element to change magnetization direction in said first or second magnetic layer; and
   a transistor which is electrically coupled to the magnetoresistive element and is a switching element to actuate the magnetoresistive element,
   wherein said magnetoresistive element is formed immediately above a drain region of said transistor.

2. A memory according to claim 1, wherein the axis of easy magnetization of said first and/or second magnetic layers is perpendicular to the layer plane.

3. A memory according to claim 1, wherein said nonmagnetic layer is an insulator.

4. A memory according to claim 1, wherein said magnetoresistive element is formed in a matrix on said substrate.

5. A memory according to claim 4, wherein a ground electrode is connected to a source region of said transistor and shared by two adjacent magnetoresistive elements.

6. A memory according to claim 5, wherein said ground electrode connected to the source region of said transistor also functions as said write line.

7. A memory according to claim 4, wherein said write line is shared by adjacent magnetoresistive elements.

8. A recording/reproducing method of a memory according to claim 4, comprising: flowing a current into said bit line and said write line when selecting a specific magnetoresistive element from plural magnetoresistive elements to conduct recording/reproducing an information.

9. A memory according to claim 1, wherein a drain electrode occupies for not less than 50% of the area of the drain region.

10. A memory according to claim 1, wherein said write line is formed closed to said substrate than said magnetoresistive element.

11. A memory according to claim 10, wherein said magnetoresistive element is formed after said transistor and said write line are formed on said substrate.

12. A memory according to claim 10, wherein said write line is formed, via an insulating layer, on an element isolation region or on a gate electrode of the transistor.

13. A memory according to claim 1, wherein said write lines are formed on the two sides of said magnetoresistive element, and electric currents are allowed to flow through said write lines in opposite directions to change the magnetization states of said magnetic layers of said magnetoresistive element.

14. A memory according to claim 13, wherein at least one write line is formed on an element isolation region or on a gate electrode of said transistor via an insulating layer.

15. A memory according to claim 1, wherein said magnetoresistive element is directly formed on the drain region of said transistor.

16. A memory according to claim 1, wherein a gate electrode of said transistor also functions as said write line.

17. A memory according to claim 1, wherein said first magnetic layer and/or said second magnetic layer is made of a rare earth-iron family alloy.

18. A memory according to claim 17, wherein in the rare earth-iron family alloy, a rare earth element contains at least one element selected from the group consisting of Gd, Tb, and Dy, and an iron family element contains at least one element selected from the group consisting of Fe and Co.

19. A memory according to claim 18, wherein another magnetic layer containing at least one element selected from the group consisting of Fe and Co is formed between said first magnetic layer and said nonmagnetic layer and/or between said second magnetic layer and said nonmagnetic layer.

20. A recording/reproducing method of a memory according to claim 1, comprising: recording information by initializing the magnetization direction in said first magnetic layer to a predetermined direction and determining the magnetization direction in said second magnetic layer of said magnetoresistive element by supplying the electric current to said write line, and reproducing recorded information by detecting the absolute value of the resistance of said magnetoresistive element.

21. A recording/reproducing method of a memory according to claim 1, comprising: recording information by determining the magnetization direction in said first magnetic layer of said magnetoresistive element by supplying the electric current to said write line, and reproducing recorded information by reversing the magnetization direction in said second magnetic layer and detecting the generated change in the resistance.

* * * * *

UNITED STATES PATENT AND TRADEMARK OFFICE
CERTIFICATE OF CORRECTION

PATENT NO. : 6,487,110 B2
DATED : November 26, 2002
INVENTOR(S) : Naoki Nishimura et al.

It is certified that error appears in the above-identified patent and that said Letters Patent is hereby corrected as shown below:

Column 7,
Line 13, "this. phenomenon" should read -- this phenomenon --.

Column 14,
Line 27, "closed" should read -- closer --.

Signed and Sealed this

First Day of July, 2003

JAMES E. ROGAN
*Director of the United States Patent and Trademark Office*